(12) United States Patent
Kato et al.

(10) Patent No.: US 10,643,837 B2
(45) Date of Patent: May 5, 2020

(54) METHOD FOR DEPOSITING A SILICON NITRIDE FILM AND FILM DEPOSITION APPARATUS

(71) Applicant: Tokyo Electron Limited, Tokyo (JP)

(72) Inventors: Hitoshi Kato, Iwate (JP); Yutaka Takahashi, Iwate (JP); Kazumi Kubo, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/057,197

(22) Filed: Aug. 7, 2018

(65) Prior Publication Data

US 2019/0051513 A1 Feb. 14, 2019

(30) Foreign Application Priority Data

Aug. 9, 2017 (JP) ................................. 2017-154743

(51) Int. Cl.
*H01L 21/02* (2006.01)
*H01L 21/687* (2006.01)
(Continued)

(52) U.S. Cl.
CPC ........ *H01L 21/0217* (2013.01); *C23C 16/045* (2013.01); *C23C 16/345* (2013.01); *C23C 16/4584* (2013.01); *C23C 16/45534* (2013.01); *C23C 16/45536* (2013.01); *C23C 16/45544* (2013.01); *C23C 16/45551* (2013.01); *C23C 16/507* (2013.01); *C23C 16/52* (2013.01); *H01J 37/321* (2013.01); *H01J 37/3244* (2013.01); *H01J 37/32357* (2013.01); *H01J 37/32449* (2013.01); *H01J 37/32513* (2013.01); *H01J 37/32715* (2013.01); *H01J 37/32724* (2013.01); *H01J 37/32733* (2013.01); *H01L 21/0228* (2013.01); *H01L 21/02211* (2013.01);
(Continued)

(58) Field of Classification Search
None
See application file for complete search history.

(56) References Cited

U.S. PATENT DOCUMENTS 8,900,963 B2 12/2014 Sills et al.
9,865,457 B2 * 1/2018 Hasebe ............... H01L 21/0217
(Continued)

FOREIGN PATENT DOCUMENTS

JP 2012-138501 7/2012
JP 2013-135154 7/2013
JP 2017-092098 5/2017

*Primary Examiner* — Thien F Tran
(74) *Attorney, Agent, or Firm* — IPUSA, PLLC

(57) ABSTRACT

A method for depositing a silicon nitride film is provided to fill a recessed pattern formed in a surface of a substrate. In the method, a first adsorption blocking region is formed by adsorbing first chlorine radicals such that an amount of adsorption increases upward from a bottom portion of the recessed pattern. A source gas that contains silicon and chlorine adsorbs on an adsorption site where the first adsorption site is not formed. A molecular layer of a silicon nitride film is deposited so as to have a V-shaped cross section. A second adsorption blocking region is formed by adsorbing second chlorine radicals on the molecular layer of the silicon nitride film. The molecular layer of the silicon nitride film is modified by nitriding the molecular layer while removing the second adsorption blocking region.

12 Claims, 14 Drawing Sheets

(51) Int. Cl.
  *H01J 37/32*    (2006.01)
  *C23C 16/34*    (2006.01)
  *C23C 16/455*   (2006.01)
  *C23C 16/52*    (2006.01)
  *H01L 21/768*   (2006.01)
  *C23C 16/458*   (2006.01)
  *C23C 16/507*   (2006.01)
  *C23C 16/04*    (2006.01)
  *C23C 16/452*   (2006.01)

(52) U.S. Cl.
  CPC .. *H01L 21/02274* (2013.01); *H01L 21/68764* (2013.01); *H01L 21/68771* (2013.01); *H01L 21/76831* (2013.01); *H01J 2237/20214* (2013.01); *H01J 2237/3321* (2013.01)

(56) References Cited

U.S. PATENT DOCUMENTS

| | | |
|---|---|---|
| 10,026,606 B2 | 7/2018 | Kato et al. |
| 2006/0199399 A1 | 9/2006 | Muscat |
| 2007/0269982 A1 | 11/2007 | Rocklein et al. |
| 2008/0242097 A1 | 10/2008 | Boescke et al. |
| 2012/0052693 A1 | 3/2012 | Ozaki et al. |
| 2013/0171822 A1 | 7/2013 | Chandrashekar et al. |
| 2014/0213037 A1 | 7/2014 | LiCausi et al. |
| 2015/0099374 A1* | 4/2015 | Kakimoto ......... C23C 16/45534 438/791 |
| 2015/0217330 A1 | 8/2015 | Haukka et al. |
| 2017/0140920 A1 | 5/2017 | Amepalli et al. |
| 2017/0140931 A1 | 5/2017 | Van Cleemput et al. |
| 2018/0237912 A1* | 8/2018 | Takahashi ............. H01J 37/321 |
| 2019/0051511 A1* | 2/2019 | Kato .................. H01L 21/0217 |
| 2019/0051512 A1* | 2/2019 | Kato .................. H01L 21/0217 |

* cited by examiner

METHOD FOR DEPOSITING A SILICON NITRIDE FILM AND FILM DEPOSITION APPARATUS

CROSS-REFERENCE TO RELATED APPLICATION

The present application is based on Japanese Priority Application No. 2017-154743 filed on Aug. 9, 2017, the entire contents of which are hereby incorporated herein by reference.

BACKGROUND OF THE INVENTION

1. Field of the Invention

The present invention relates to a method for depositing a silicon nitride film and a film deposition apparatus.

2. Description of the Related Art

Conventionally, as disclosed in Japanese Laid-Open Patent Application Publication No. 2017-92098, a method for depositing a silicon nitride film in a fine recess is known that repeats a process of adsorbing a film deposition source gas that contains an element constituted of a nitride film to be deposited and chloride, and a process of nitriding the adsorbed film deposition source gas using nitriding active species. In the nitriding process, NH* active species and N* active species are generated as the nitriding active species, and a region on which the film deposition source gas adsorbs is changed by controlling a concentration of the NH* active species and the N* active species in the fine recess.

The method for depositing the nitride film performs an initial film deposition stage that forms a conformal nitriding film by performing a nitriding process mainly using the NH* active species prior to a film deposition process, and then performs a film deposition stage in which a concentration of the N* active species is continuously decreased from a high concentration state of the N* active species and a nitride film is deposited from a trench bottom in a nitriding process. Thus, a nitride film is deposited by bottom-up growth from the trench bottom, and then a conformal film is deposited with the high NH* active species, thereby depositing a nitride film without forming a void or a seam in the fine trench.

However, because the method for depositing the nitride film described in Japanese Laid-Open Patent Application Publication No. 2017-92098 needs to change the concentration of the NH* active species and the N* active species in accordance with a stage of the film deposition, supply control of the gas during the film deposition may be difficult.

Moreover, when filing deposition is performed by bottom-up growth, because a film thickness of a bottom portion is thick whereas the film thickness of an upper portion is thin, the bottom portion is insufficiently modified whereas the upper portion is sufficiently modified when the film is modified by plasma, which is liable to decrease film quality.

Therefore, one embodiment of the present disclosure is intended to provide a method for depositing a silicon nitride film and film deposition apparatus that can fill a recessed pattern with a high-quality film by bottom-up growth.

SUMMARY OF THE INVENTION

The present invention is made in light of the above problems, and provides a film deposition method and film deposition apparatus that can fill a recess with a nitriding film with high bottom-up properties by using a simple process and apparatus.

According to an embodiment, there is provided a method for depositing a silicon nitride film for depositing a silicon nitride film to fill a recessed pattern formed in a surface of a substrate with a silicon nitride film. In the method, a first adsorption blocking region is formed by adsorbing first chlorine radicals such that an amount of adsorption increases upward from a bottom portion of the recessed pattern. A source gas that contains silicon and chlorine adsorbs on an adsorption site where the first adsorption site is not formed of the surface of the substrate including an inner surface of the recessed pattern by supplying the source gas to the surface of the substrate. A molecular layer is deposited of a silicon nitride film having a V-shaped cross section that decreases its film thickness upward from the bottom portion of the trench by nitriding the source gas adsorbed on the adsorption site with a first nitriding gas activated by a first plasma. A second adsorption blocking region is formed by adsorbing second chlorine radicals on the molecular layer of the silicon nitride film such that an amount of adsorption increases upward from the bottom portion. The molecular layer of the silicon nitride film is modified by nitriding the molecular layer while removing the second adsorption blocking region by supplying a second nitriding gas activated by a second plasma to the surface of the substrate.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

DETAILED DESCRIPTION OF THE PREFERRED EMBODIMENTS

Embodiments of the present disclosure are described below with reference to the accompanying drawings.

Figure 1:
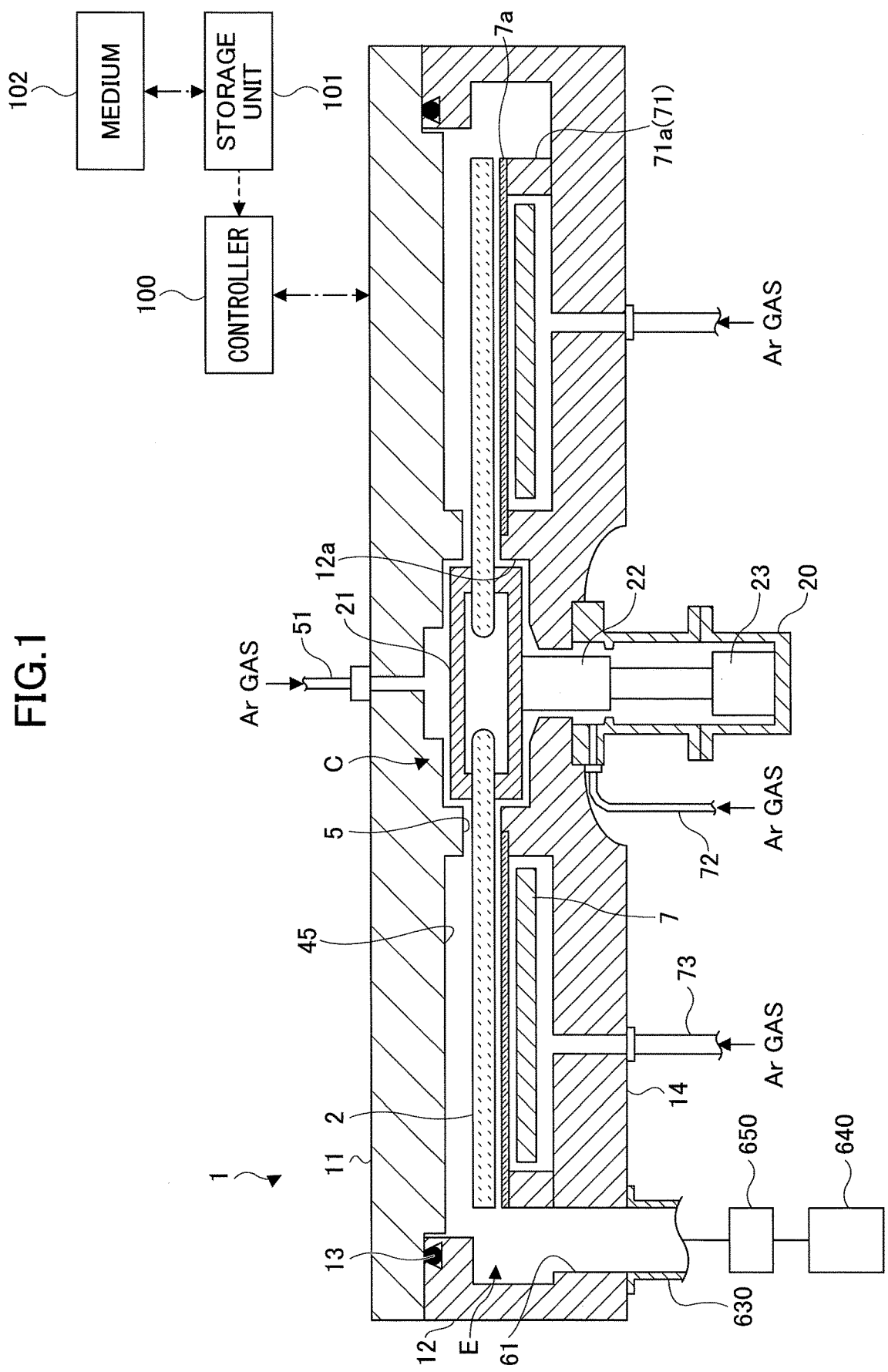
FIG. 1 is a schematic cross-sectional view illustrating a film deposition apparatus according to an embodiment of the present disclosure.
Figure 2:
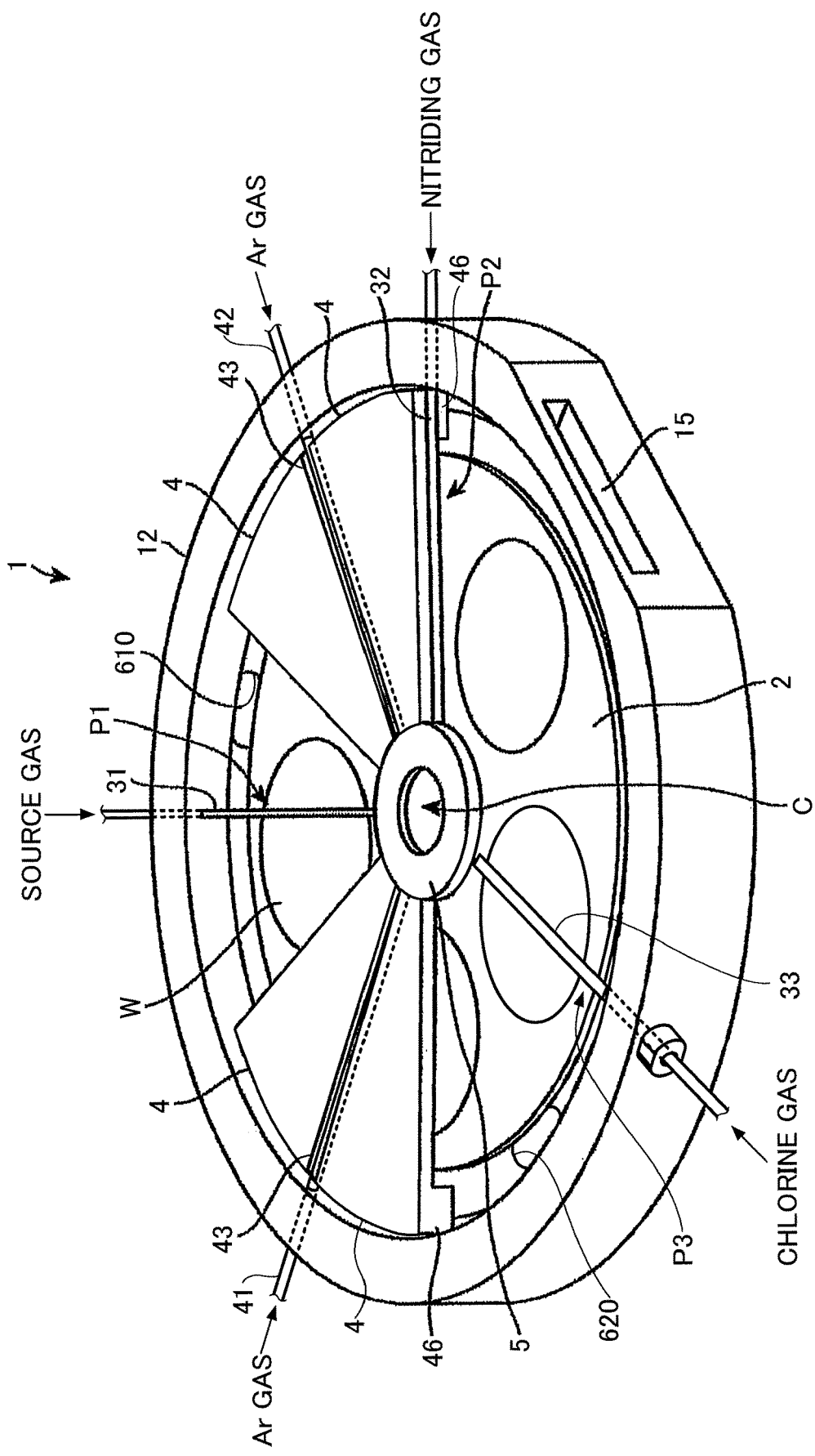
FIG. 2 is a schematic perspective view illustrating an inner structure of a vacuum chamber of a film deposition apparatus according to an embodiment of the present disclosure.
Figure 3:
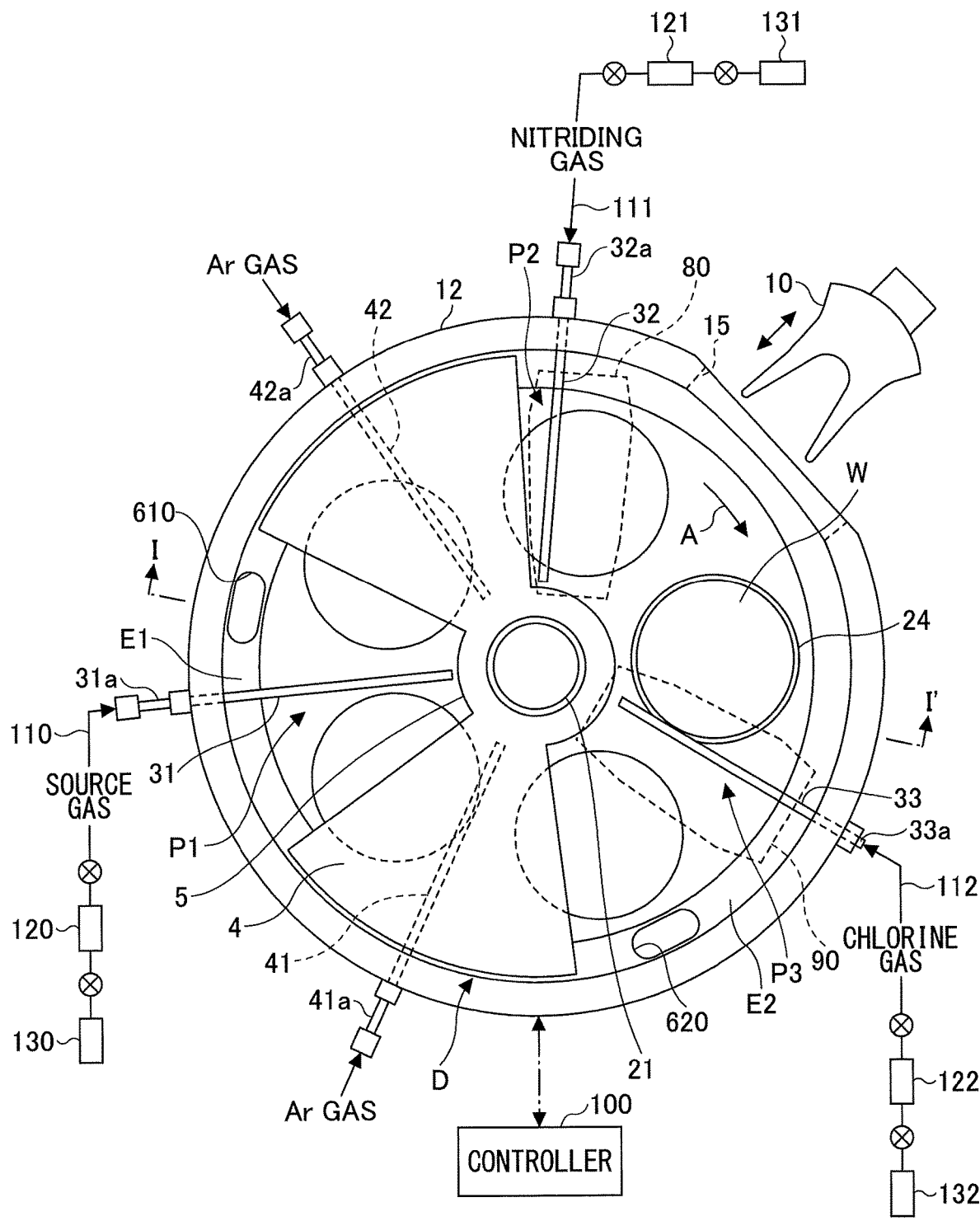
FIG. 3 is a schematic top view illustrating an inner structure of a vacuum chamber of a film deposition apparatus according to an embodiment of the present disclosure.

To begin with, a film deposition apparatus according to an embodiment of the present disclosure is described below. With reference to FIGS. 1 through 3, the film deposition apparatus includes a vacuum chamber 1 having a substantially flat circular shape, and a turntable 2 having a rotational axis coincident with the center of the vacuum chamber 1. The vacuum chamber 1 is a process chamber to accommodate a wafer therein and to deposit a film on a surface of the wafer. The vacuum chamber 1 includes a chamber body 12 having a cylindrical shape with a bottom surface, and a ceiling plate 11 placed on the upper surface of the chamber body 12. The ceiling plate 11 is detachably placed on the chamber body 12 via a sealing member 13 (FIG. 1) such as an O-ring in an airtight manner.

The turntable 2 is provided in the vacuum chamber 1. The turntable 2 is attached to a cylindrical shaped core unit 21 at its center portion. The core unit 21 is fixed to the upper end of a rotary shaft 22 that extends in the vertical direction. The rotary shaft 22 is provided to penetrate through a bottom portion 14 of the vacuum chamber 1, and the lower end of the rotary shaft 22 is attached to a driving unit 23 that rotates the rotary shaft 22 (FIG. 1) about a vertical axis. The rotary shaft 22 and the driving unit 23 are housed in the cylindrical case body 20 whose upper surface is open. The case body 20 is attached to a lower surface of the bottom portion 14 of the vacuum chamber 1 via a flange portion provided at its upper surface in an airtight manner so that inner atmosphere of the case body 20 is isolated from external atmosphere.

As illustrated in FIGS. 2 and 3, a plurality of (five in the example of the drawing) circular concave portions 24 is provided in a top surface of the turntable 2 along a rotating direction (circumferential direction) to receive the plurality of semiconductor wafers (which will be simply referred to as "wafers" hereinafter) W, respectively. In FIG. 3, only a single wafer W is illustrated in one of the concave portions 24 for an explanatory purpose. Each of the concave portions 24 is formed to have a slightly larger (for example, 4 mm larger) diameter than that (for example, 300 mm) of the wafer W, and to have a depth substantially equal to the thickness of the wafer W. Thus, when the wafer W is placed in the respective concave portion 24, the surface of the wafer W and the surface of the turntable 2 (where the wafer W is not placed) become almost the same height. Each of the concave portions 24 has three, for example, through holes formed in the bottom, through which lift pins for supporting a back surface of the respective wafer W and lifting the wafer W penetrate.

FIGS. 2 and 3 are diagrams for explaining an inner structure of the vacuum chamber 1. The ceiling plate 11 is not illustrated in FIGS. 2 and 3 for an explanatory purpose. As illustrated in FIGS. 2 and 3, a reaction gas nozzle 31, a reaction gas nozzle 32, a reaction gas nozzle 33, and separation gas nozzles 41 and 42, which are made of quartz, for example, are provided above the turntable 2. In the example illustrated in FIG. 3, the reaction gas nozzle 33, the separation gas nozzle 41, the reaction gas nozzle 31, the separation gas nozzle 42, and the reaction gas nozzle 32 are arranged in this order from a transfer port 15 (which will be explained later) in a clockwise direction (the rotation direction of the turntable 2 as illustrated by an arrow A in FIG. 3) with a space therebetween in a circumferential direction of the vacuum chamber 1. Gas introduction ports 31a, 32a, 33a, 41a, and 42a (FIG. 3) that are base portions of the nozzles 31, 32, 33, 41, and 42, respectively, are fixed to an outer peripheral wall of the chamber body 12 so that these nozzles 31, 32, 33, 41, and 42 are introduced into the vacuum chamber 1 from the outer peripheral wall of the vacuum chamber 1 so as to extend in a radial direction and parallel to the surface of the turntable 2.

In this embodiment, as illustrated in FIG. 3, the reaction gas nozzle 31 is connected to a supply source 130 (not illustrated in the drawings) of a source gas via a pipe 110, a flow controller 120 and the like (not illustrated in the drawings). The reaction gas nozzle 32 is connected to a supply source 131 (not illustrated in the drawings) of a nitriding gas via a pipe 111, a flow controller 121 and the like (not illustrated in the drawings). The reaction gas nozzle 33 is connected to a supply source 132 (not illustrated in the drawings) of chlorine ($Cl_2$) gas via a pipe 112, a flow controller 122 and the like (not illustrated in the drawings). The separation gas nozzles 41 and 42 are connected to supply sources (not illustrated in the drawings) of a separation gas via pipes and flow controller valves and the like, respectively. A noble gas such as helium (He) or argon (Ar) or inert gas such as nitrogen ($N_2$) gas can be used as the separation gas. The present embodiment is described by citing an example of using Ar gas as the separation gas.

Each of the reaction gas nozzles 31, 32 and 33 has a plurality of gas discharge holes 35 that faces downward to the turntable 2 along the longitudinal directions of each of the reaction gas nozzles 31, 32 and 33 at intervals of 10 mm, for example. A region below the reaction gas nozzle 31 is a first process region P1 in which the source gas adsorbs on the wafers W. A region below the reaction gas nozzle 32 is a second process region P2 in which the nitriding gas that nitrides the source gas adsorbed on the wafer W is supplied, thereby producing a molecular layer of a nitride. The molecular layer of the nitride constitutes a film to be deposited. A region below the reaction gas nozzle 33 is a third process region P3 in which chlorine gas activated by plasma is supplied to the reaction product (nitride film) produced in the second process region P2, thereby forming an adsorption blocking group. Here, because the first process region P1 is a region where the source gas is supplied, the first process region P1 may be referred to as a source gas supply region P1. Similarly, because the second process region P2 is a region where the nitriding gas that reacts with the source gas and produces the nitride is supplied, the second process region P2 may be referred to as a nitriding gas supply region P2. Also, the third process region P3 is a region where chlorine gas is supplied, the third process region P3 may be referred to as a chlorine gas supply region P3.

A plasma generator 90 is provided around the third process region, for example, over or laterally to the third process region P3. A plasma generator 80 is also provided over the second process region P2. In FIG. 3, the plasma generators 80 and 90 are simply illustrated by a dotted line for an explanatory purpose. The plasma generator 90 is constituted of a remote plasma generator to generate chlorine radicals. In contrast, a type of the plasma generator 80 is not particularly limited, and for example, the plasma generator 80 may be constituted of an ICP (Inductively Coupled Plasma) plasma generator. Details of the plasma generators 80 and 90 will be described below.

A gas that contains silicon and chlorine is selected as the source gas. For example, when a silicon nitride (SiN) film is deposited, a gas that contains silicon and chlorine such as dichlorosilane (DCS, $SiH_2Cl_2$) is selected. Here, a variety of gases may be used as the source gas as long as the source gas contains silicon and chlorine. For example, in addition to dichlorosilane, another chlorosilane-based gas such as monochlorosilane ($SiH_3Cl$), trichlorosilane ($SiHCl_3$), hexachlorodisilane ($Si_2Cl_6$) may be used depending on the intended use. DCS is cited as an example of such a gas that contains silicon and chlorine.

In general, ammonia ($NH_3$) containing gas is selected as the nitriding gas. A nitrogen ($N_2$) containing gas may be selected when the nitriding gas is supplied while being activated by plasma other than ammonia gas. Here, the nitriding gas may contain a carrier gas such as Ar in addition to ammonia.

Chlorine gas supplied from the third reaction gas nozzle 33 serves to form on a surface of a wafer W an adsorption blocking group that blocks the source gas supplied from the first reaction gas nozzle 31 from adsorbing on the surface of the wafer W. The film deposition apparatus and the method for depositing the silicon nitride film according to the embodiment forms the adsorption blocking region in a wide area, and controls so that the source gas uniformly adsorbs on the surface of the wafer W. Here, the method for depositing the silicon nitride film will be described in detail below. Moreover, FIGS. 2 and 3 illustrate the horizontally extending nozzle as the third reaction nozzle 33, but the third reaction gas nozzle 33 may be formed as a showerhead. In FIGS. 2 and 3, an example of forming the third reaction gas nozzle 33 as the horizontally extending nozzle is described, and an example of forming the third reaction gas nozzle 33 as a showerhead will be described below.

Referring to FIGS. 2 and 3, the ceiling plate 11 includes two convex portions 4 in the vacuum chamber 1. As will be explained below, the convex portions 4 are attached to a lower surface of the ceiling plate 11 so as to protrude toward the turntable 2 to form separation regions D with the corresponding separation gas nozzles 41 and 42. Each of the convex portions 4 has substantially a fan-like planar shape where the apex is removed in an arc shape. For each of the convex portions 4, the inner arc shaped portion is connected to a protruding portion 5 (which will be explained below) and the outer arc shaped portion is formed to extend along an inner peripheral surface of the chamber body 12 of the vacuum chamber 1.

Figure 4:
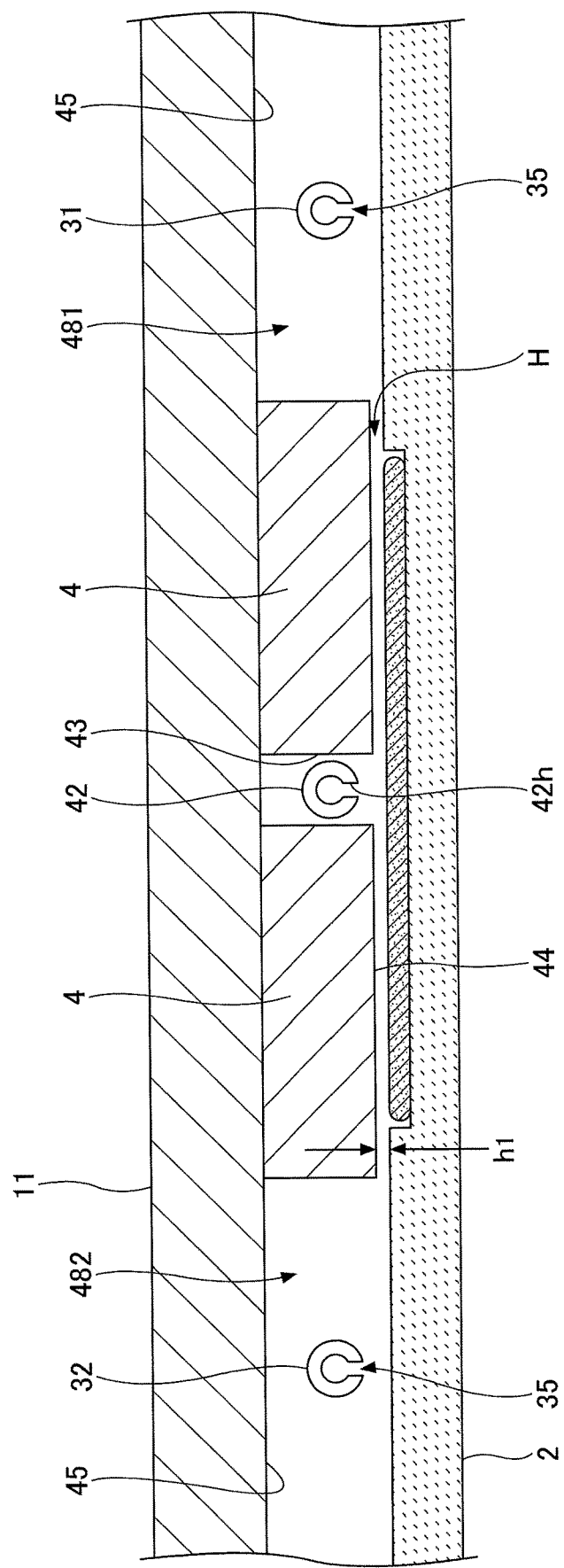
FIG. 4 is a schematic partial cross-sectional view of a vacuum chamber of a film deposition apparatus according to an embodiment of the present disclosure taken along a concentric circle of a turntable.

FIG. 4 illustrates a cross-section of the vacuum chamber 1 along a concentric circle of the turntable 2 from the reaction gas nozzle 31 to the reaction gas nozzle 32. As illustrated in FIG. 4, the convex portion 4 is fixed to the lower surface of the ceiling plate 11. Thus, the vacuum chamber 1 includes a flat low ceiling surface 44 (first ceiling surface) formed as the lower surface of the convex portion 4, and flat higher ceiling surfaces 45 (second ceiling surfaces) which are higher than the low ceiling surface 44 and formed on both sides of the low ceiling surface 44 in the circumferential direction. The low ceiling surface 44 has substantially a fan-like planar shape where the apex is removed in an arc shape. Furthermore, as illustrated in the drawings, the convex portion 4 includes a groove portion 43 at a center in the circumferential direction. The groove portion 43 is formed to extend in the radial direction of the turntable 2. The separation gas nozzle 42 is housed in the groove portion 43. Although not illustrated in FIG. 4, the separation gas nozzle 41 is also housed in a groove portion provided in the other convex portion 4. The reaction gas nozzles 31 and 32 are provided in spaces below the high ceiling surfaces 45, respectively. The reaction gas nozzles 31 and 32 are provided in the vicinity of the wafers W apart from the high ceiling surfaces 45, respectively. Here, the reaction gas nozzle 31 is provided in a space 481 below and on the right side of the high ceiling surface 45, and the reaction gas nozzle 32 is provided in a space 482 below and on the left side of the high ceiling surface 45.

Each of the separation gas nozzles 41 and 42 has a plurality of gas discharge holes 42h (see FIG. 4) formed along the longitudinal direction thereof at a predetermined interval (10 mm, for example).

The low ceiling surface 44 provides a separation space H, which is a narrow space, with respect to the turntable 2. When Ar gas is supplied from the separation gas nozzle 42 to the separation space H, this Ar gas flows toward the space 481 and the space 482 through the separation space H. On this occasion, because the volume of the separation space H is smaller than those of the spaces 481 and 482, the pressure in the separation space H can be made higher than those in the spaces 481 and 482 by Ar gas. It means that the separation space H having the higher pressure is formed between the spaces 481 and 482. Moreover, Ar gas flowing from the separation space H toward the spaces 481 and 482 serves as a counter flow against the source gas from the gas first process region P1 and the nitriding gas from the second process region P2. Thus, the source gas from the first process region P1 is separated from the nitriding gas from the second process region P2 by the separation space H. Therefore, mixing and reacting of the source gas with the nitriding gas are prevented in the vacuum chamber 1.

The height h1 of the low ceiling surface 44 above an upper surface of the turntable 2 is preferred to be appropriately determined based on the pressure of the vacuum chamber 1 during the film deposition, the rotational speed of the turntable 2, and a supplying amount of the separation gas (Ar gas) in order to maintain the pressure in the separation space H higher than those in the spaces 481 and 482.

Referring to FIGS. 1 through 3, the ceiling plate 11 further includes the protruding portion 5 at its lower surface to surround the outer periphery of the core unit 21 that supports the turntable 2. The protruding portion 5 is continuously formed with the inner portions of the convex portions 4 and has a lower surface that is formed at the same height as those of the low ceiling surfaces 44, in this embodiment.

Figure 5:
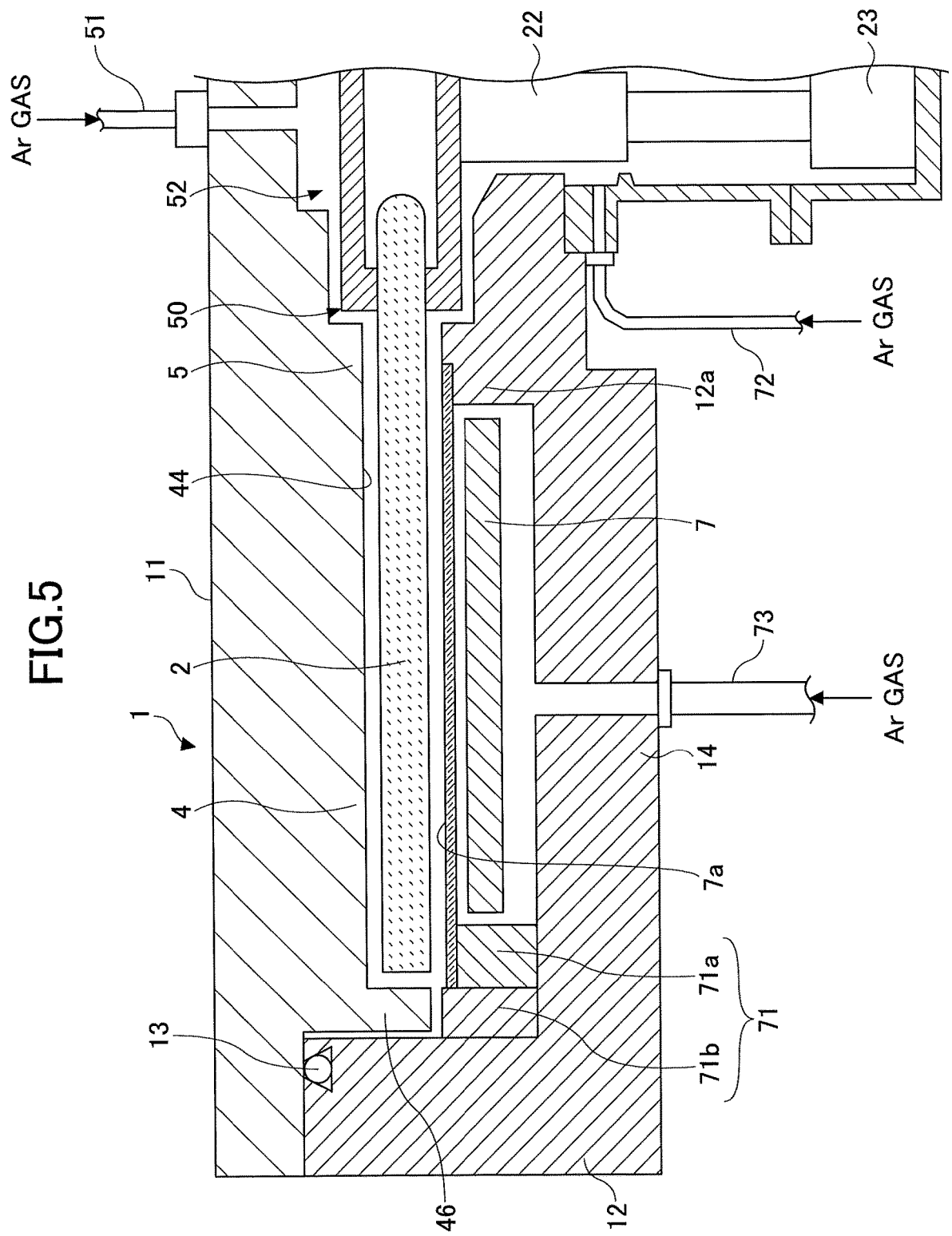
FIG. 5 is another schematic cross-sectional view of a film deposition apparatus according to an embodiment of the present disclosure.

FIG. 1 is a cross-sectional view taken along an I-I' line in FIG. 3, and illustrating an area where the ceiling surface 45 is provided. FIG. 5 is a partial cross-sectional view illustrating an area where the ceiling surface 44 is provided. As illustrated in FIG. 5, the convex portion 4 having a substantially fan-like planar shape includes an outer bending portion 46 at its outer peripheral end portion (at an outer peripheral end portion side of the vacuum chamber 1) which is bent to have an L-shape to face an outer end surface of the turntable 2. The outer bending portion 46 inhibits a flow of gas between the space 481 and the space 482 through the space between the turntable 2 and the inner peripheral surface of the chamber body 12. As described above, the convex portions 4 are provided on the ceiling plate 11 which is detachably attached to the chamber body 12. Thus, a slight space is provided between the outer periphery surface of the outer bending portion 46 and the chamber body 12. The spaces between the inner periphery surface of the outer bending portion 46 and an outer surface of the turntable 2, and the space between the outer periphery surface of the outer bending portion 46 and the chamber body 12 are set at the same size as the height h1 (see FIG. 4) of the low ceiling surface 44 with respect to the upper surface of the turntable 2, for example.

As illustrated in FIG. 5, the inner peripheral wall of the chamber body 12 is provided to extend in a vertical direction to be closer to the outer peripheral surface of the outer bending portion 46 at the separation region H. However, other than the separation region H, as illustrated in FIG. 1, for example, the inner peripheral wall of the chamber body 12 is recessed outward in a range from a location facing the outer end surface of the turntable 2 to the upper end of the bottom portion 14. Hereinafter, for an explanatory purpose, the concave portion, having a substantially rectangular cross-sectional view, is referred to as an "evacuation region." Specifically, a part of the evacuation region which is in communication with the first process region P1 is referred to as a first evacuation region E1, and a part of the evacuation region which is in communication with the second and third process regions P2 and P3 is referred to as a second evacuation region E2. As illustrated in FIGS. 1 through 3, a first evacuation port 610 and a second evacuation port 620 are respectively provided at the bottom portions of the first evacuation region E1 and the second evacuation region E2. The first evacuation port 610 and the second evacuation port 620 are connected to vacuum pumps 640, which are vacuum evacuation units, via evacuation pipes 630, respectively, as illustrated in FIG. 1. Moreover, a pressure controller 650 is provided between the vacuum pumps 640 and the evacuation pipes 630 in FIG. 1.

As illustrated in FIGS. 2 and 3, although a separation region H is not provided between the second process region P2 and the third process region P3, as illustrated in FIG. 3, a casing that partitions a space above the turntable 2 is provided in a region illustrated as the plasma generator 80. Otherwise, when the casing is not provided for the plasma generator 80, a casing is provided for the plasma generator 80a, and the space between the second process region P2 and the third process region P3 is partitioned. This point will be described later in detail.

As illustrated in FIGS. 1 and 5, a heater unit 7, which is a heating device, is provided in a space between the bottom portion 14 of the vacuum chamber 1 and the turntable 2, and heats a wafer W on the turntable 2 via the turntable 2 up to a temperature determined by a process recipe (e.g., 400° C.). As illustrated in FIG. 5, a ring-shaped cover member 71 is provided below, at and near the periphery of the turntable 2 to prevent a gas from entering an area under the turntable 2 by separating an atmosphere from a space above the turntable 2 to the evacuation regions E1 and E2 from an atmosphere in which the heater unit 7 is placed. The cover member 71 includes an inner member 71a provided under the periphery and outside of the turntable 2 and an outer member 71b provided between the inner member 71a and the inner side wall of the vacuum chamber 1. The outer member 71b is provided to face the outer bending portion 46, which is formed at an outer edge portion at lower side of each of the convex portions 4. The inner member 71a is provided to surround the entirety of the heater unit 7 below the outer end portion (and at a slightly outer side of the outer edge portion) of the turntable 2.

The bottom portion 14 of the vacuum chamber 1 closer to the rotation center than the space where the heater unit 7 is provided protrudes upward to be close to the core unit 21 to form a projecting portion 12a. A narrow space is provided between the projecting portion 12a and the core unit 21. Furthermore, a narrow space is provided between an inner peripheral surface of the bottom portion 14 and the rotary shaft 22 to be in communication with the case body 20. A purge gas supplying pipe 72 which supplies Ar gas as the purge gas to the narrow space for purging is provided in the case body 20. The bottom portion 14 of the vacuum chamber 1 includes a plurality of purge gas supplying pipes 73 (only one of the purge gas supplying pipes 73 is illustrated in FIG. 5) which are provided at a predetermined angle interval in the circumferential direction below the heater unit 7 for purging the space where the heater unit 7 is provided. Moreover, a cover member 7a is provided between the heater unit 7 and the turntable 2 to prevent the gas from going into the space where the heater unit 7 is provided. The cover member 7a is provided to extend from an inner peripheral wall (upper surface of the inner member 71a) of the outer member 71b to an upper end portion of the projecting portion 12a in the circumferential direction. The cover member 7a may be made of quartz, for example.

The film deposition apparatus 1 further includes a separation gas supplying pipe 51 that is connected to a center portion of the ceiling plate 11 of the vacuum chamber 1 and is provided to supply Ar gas as the separation gas to a space 52 between the ceiling plate 11 and the core unit 21. The separation gas supplied to the space 52 flows through a narrow space between the protruding portion 5 and the turntable 2 so as to flow along the top surface of the turntable 2 where the wafers W are to be placed and is discharged toward the outer periphery. The space 50 is kept at a pressure higher than those of the space 481 and the space 482 by the separation gas. Thus, the mixing of the source gas supplied to the first process region P1 and the nitriding gas supplied to the second process region P2 by flowing through the center area C can be prevented by the space 50. It means that the space 50 (or the center area C) can function similarly to the separation space H (or the separation region D).

In addition, as illustrated in FIGS. 2 and 3, a transfer port 15 is formed in a side wall of the vacuum chamber 1 for allowing the wafers W, which are substrates, to pass between an external transfer arm 10 and the turntable 2. The transfer port 15 is opened and closed by a gate valve (not illustrated in the drawings). Furthermore, lift pins, which penetrate through the concave portion 24 to lift up the wafer W from a backside surface, and a lifting mechanism for the lift pins (both are not illustrated in the drawings) are provided at a location where the wafer W is transferred and below the turntable 2 because the wafer W is transferred between the external transfer arm 10 and the concave portion 24 of the turntable 2, which is a substrate receiving area, at a location facing the transfer port 15.

Figure 6:
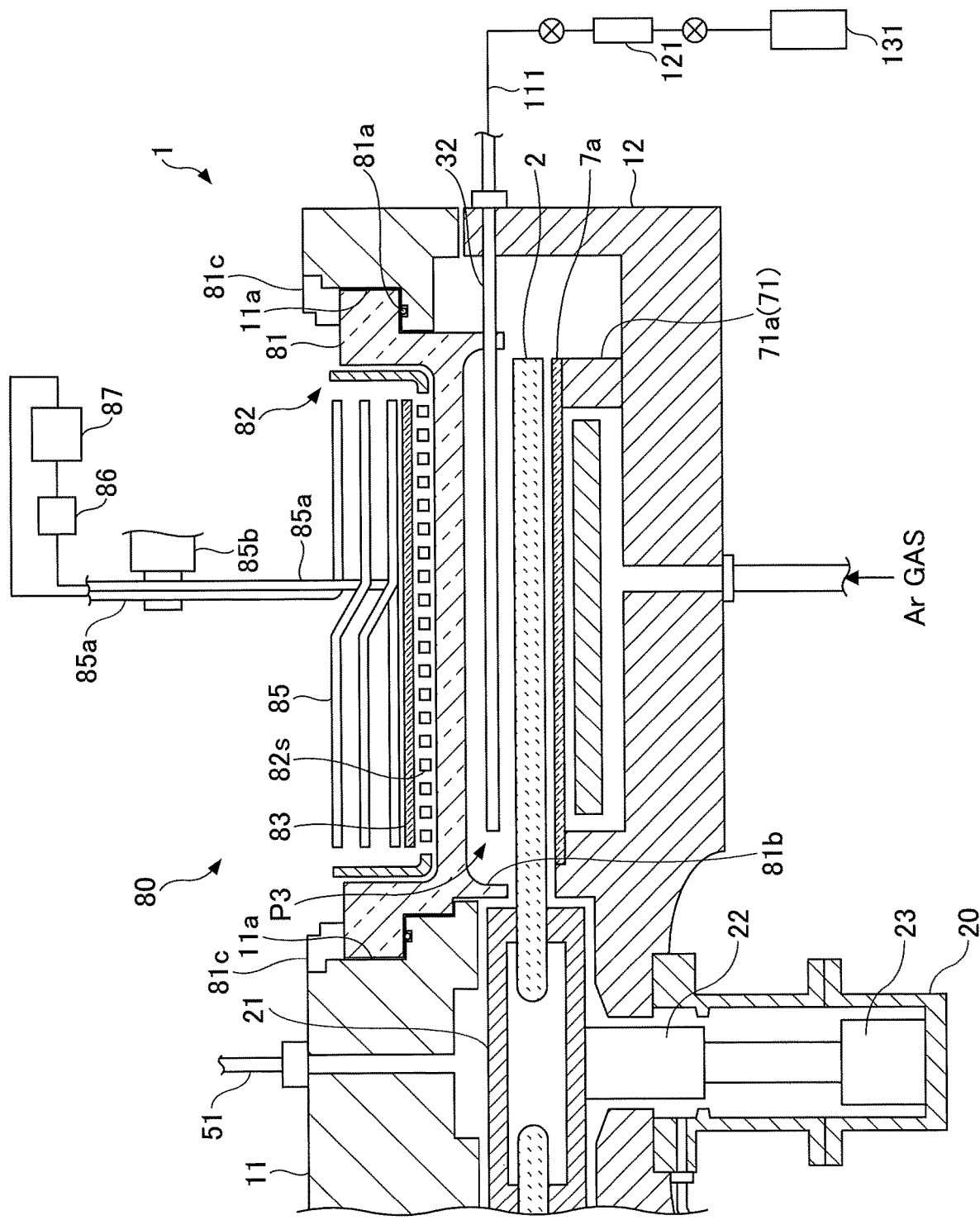
FIG. 6 is a schematic cross-sectional view of a plasma generator provided in a film deposition apparatus according to an embodiment of the present disclosure.
Figure 7:
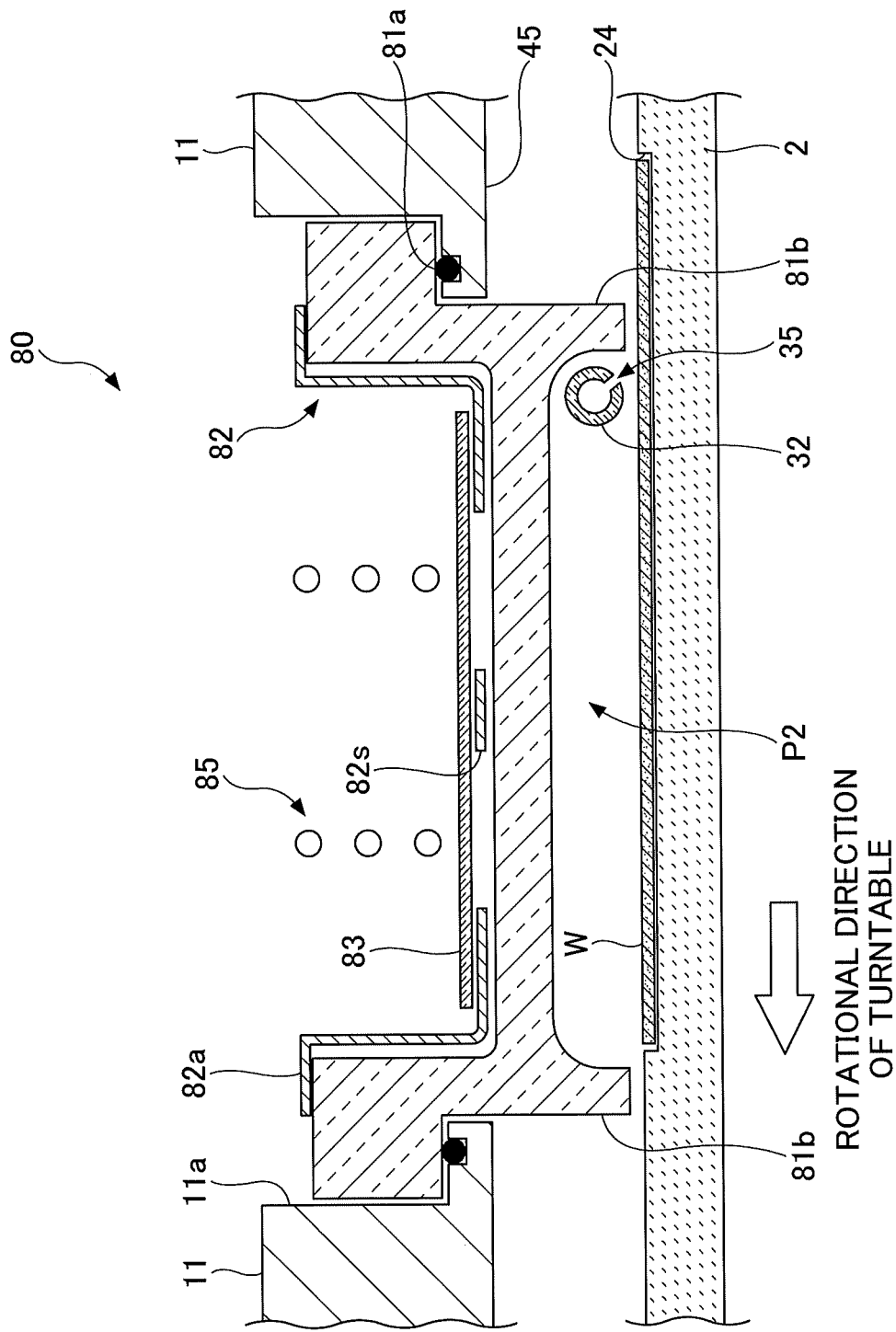
FIG. 7 is another schematic cross-sectional view of a plasma generator according to an embodiment of the present disclosure.
Figure 8:
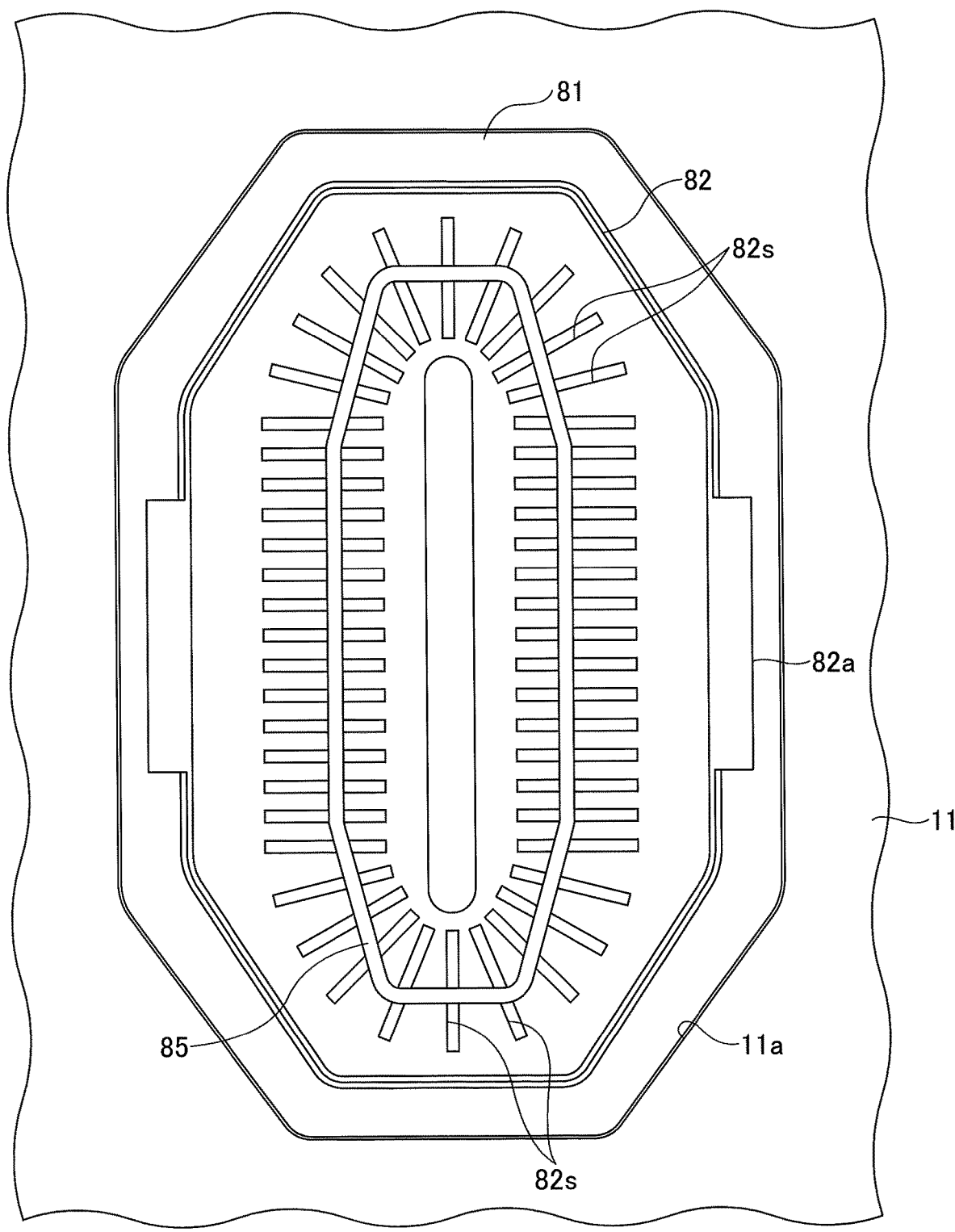
FIG. 8 is a schematic top view of a plasma generator according to an embodiment of the present disclosure.

Next, the plasma generator 80 is described below with reference to FIGS. 6 through 8. FIG. 6 is a schematic cross-sectional view of the plasma generator 80 taken along the radial direction of the turntable 2. FIG. 7 is a schematic cross-sectional view of the plasma generator 80 taken along a direction perpendicular to the radial direction of the turntable 2. FIG. 8 is a schematic top view illustrating the plasma generator 80. For an explanatory purpose, parts of the components are simplified or not illustrated in the drawings.

Referring to FIG. 6, the plasma generator 80 is made of a material that transmits radio frequency waves, and has a concave portion in its upper surface. The plasma generator 80 further includes a frame member 81 that is embedded in an opening 11a provided in the ceiling plate 11, a Faraday shield plate 82 housed in the concave portion of, the frame member 81 and having substantially a box shape whose top is opened, an insulating plate 83 placed on a bottom surface of the Faraday shield plate 82, and a coil antenna 85 supported by the insulating plate 83 thereon. The antenna 85 has substantially an octagonal planar shape.

The opening 11a of the ceiling plate 11 is formed to have a plurality of step portions, and one of the step portions has a groove portion to extend along the perimeter where a sealing member 81a such as an O-ring or the like is embedded. The frame member 81 is formed to have a plurality of step portions that correspond to the step portions of the opening 11a, and when the frame member 81 is engaged in the opening 11a, a back side surface of one of the step portions contacts the sealing member 81a embedded in the opening 11a so that the ceiling plate 11 and the frame member 81 are kept in an air-tight manner. Moreover, as illustrated in FIG. 6, a pushing member 81c, which extends along the outer periphery of the frame member 81 that is fitted in the opening 11a of the ceiling plate 11, is provided so that the frame member 81 is pushed downward with respect to the ceiling plate 11. Thus, the ceiling plate 11 and the frame member 81 are further kept in an air-tight manner.

The lower surface of the frame member 81 is positioned to face the turntable 2 in the vacuum chamber 1 and a projection portion 81b that projects downward (toward the turntable 2) is provided at the perimeter at the lower surface. The lower surface of the projection portion 81b is close to the surface of the turntable 2 and a space (hereinafter referred to as the third process region P3) is surrounded by the projection portion 81b, the surface of the turntable 2 and the lower surface of the frame member 81 above the turntable 2. The space between the lower surface of the projection portion 81b and the surface of the turntable 2 may be the same as the height h1 between the ceiling surface 44 and the upper surface of the turntable 2 in the separation space H (FIG. 4).

In addition, the reaction gas nozzle 32 that penetrates through the projection portion 81b is provided in the second process region P2. In this embodiment, as illustrated in FIG. 6, the nitriding gas supply source 131 filled with nitriding gas is connected to the reaction gas nozzle 32 through the pipe 111 via the flow controller 121. The nitriding gas may be, for example, a gas that contains ammonia ($NH_3$). More specifically, the nitriding gas may be a mixed gas of ammonia ($NH_3$) and argon (Ar). The nitriding gas whose flow rate is controlled by the flow controller 121 is activated by the plasma generator 80 and is supplied to the second process region P2 at a predetermined flow rate. Here, when the mixed gas of ammonia and argon is used as the nitriding gas, ammonia and argon may be separately supplied, but FIG. 6 illustrates an example of supplying ammonia and argon to the reaction gas nozzle 32 in a state of mixed gas for convenience of explanation.

The reaction gas nozzle 32 has a plurality of gas discharge holes 35 formed along the longitudinal direction thereof at a predetermined interval (10 mm, for example), and the above-mentioned chlorine gas is discharged from the gas discharge holes 35. As illustrated in FIG. 7, the gas discharge holes 35 are provided to be inclined from a vertical direction with respect to the turntable 2 toward the upstream rotational direction of the turntable 2. Due to this, the gas supplied from the reaction gas nozzle 33 is discharged in a direction opposite to the rotational direction of the turntable 2, specifically, toward a gap between a lower surface of the projection portion 81b and the surface of the turntable 2. Thus, the flows of the reaction gas and the separation gas from a space below the ceiling surface 45 that is upstream of the plasma generator 80 toward the second process region P2 along the rotation direction of the turntable 2 can be prevented. Furthermore, as described above, because the projection portion 81b that is formed along an outer periphery of the lower surface of the frame member 81 is close to the surface of the turntable 2, the pressure in the third process region can be kept high by the gas from the reaction gas nozzle 32. This also prevents the reaction gas and the separation gas from flowing into the second process region P2.

Thus, the frame member 81 plays a role in separating the second process region P2 from the surroundings. Hence, the film deposition apparatus according to the embodiment includes the frame member 81 together with the plasma generator 80 to separate the second process region P2.

The Faraday shield plate 82 is made of a conductive material such as a metal and is grounded, although not illustrated in the drawings. As clearly illustrated in FIG. 8, the Faraday shield plate 82 has a plurality of slits 82s at its bottom portion. Each of the slits 82s extends substantially perpendicularly to a corresponding side of the antenna 85 that has the substantially octagonal planar shape.

As illustrated in FIGS. 7 and 8, the Faraday shield plate 82 includes two support portions 82a that are provided at upper end portions to bend outward. The support portions 82a are supported by the upper surface of the frame member 81 so that the Faraday shield plate 82 is supported at a predetermined position in the frame member 81.

The insulating plate 83 is made of fused quartz, for example, has a size slightly smaller than that of the bottom surface of the Faraday shield plate 82, and is mounted on the bottom surface of the Faraday shield plate 82. The insulating plate 83 insulates the Faraday shield plate 82 from the antenna 85 while passing the radio frequency waves radiated from the antenna 85 downward.

The antenna 85 is formed by winding a pipe made of copper three times, for example, in a substantially octagonal planar shape. Thus, cooling water can be circulated in the pipe, and the antenna 85 is prevented from being heated to a high temperature by the radio frequency waves supplied to the antenna 85. As illustrated in FIG. 6, the antenna 85 includes a standing portion 85a to which a support portion 85b is attached. The antenna 85 is maintained at a predetermined position in the Faraday shield plate 82 by the support portion 85b. The radio frequency power source 87 is connected to the support portion 85b via the matching box 86. The radio frequency power source 87 is capable of generating radio frequency power having a frequency of 13.56 MHz, for example.

According to the plasma generator 80 thus structured, when the radio frequency power source 87 supplies the radio frequency power to the antenna 85 via the matching box 86, the antenna 85 generates an electromagnetic field. In the electromagnetic field, the Faraday shield plate 82 cuts the electric field component so as not to transmit the electric field component downward. On the other hand, the magnetic field component is transmitted into the second process region P2 through the plurality of slits 82s of the Faraday shield plate 82. The magnetic field component activates the nitriding gas supplied to the second process region P2 from the reaction gas nozzle 32 at a predetermined flow rate.

Next, the plasma generator 90 of the film deposition apparatus according to the embodiment of the present disclosure is described below.

Figure 9:
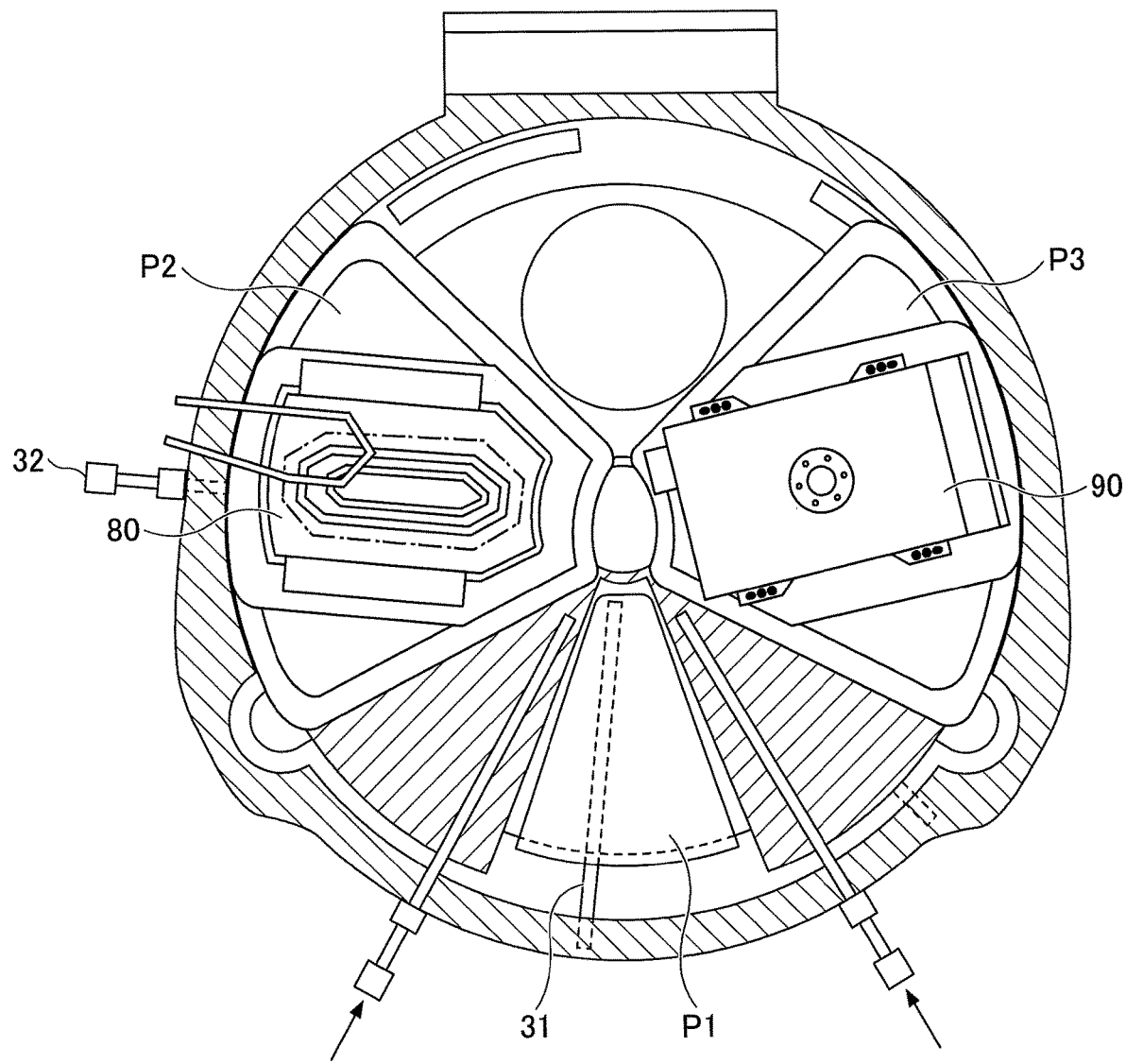
FIG. 9 is a schematic planar view illustrating an example of a film deposition method according to an embodiment of the present disclosure.

FIG. 9 is a planar view of the film deposition apparatus on which the plasma generators 80 and 90 are mounted according to the embodiment of the present disclosure. The plasma generator 90 is formed as a remote plasma generator.

The inductively coupled plasma (ICP) generator 80 using the antenna 85, which is described with reference to FIGS. 6 through 8, is effective to generate plasma with high intensity and works well when both ionized nitrogen gas and radicalized nitrogen gas may be generated. However, when chlorine ions are not needed and only chlorine radicals are needed, the remote plasma generator is more preferred to the inductively coupled plasma generator. In other words, because the remote plasma generator activates chlorine outside the vacuum chamber 1 by plasma, the ionized chlorine that has a short lifetime is inactivated before reaching the vacuum chamber 1 or the wafer W, and only the radicalized chlorine that has a long lifetime is supplied to the wafer W. Thus, the activated chlorine gas dominated by the chlorine radicals that are less activated than the ICP plasma generator that directly produces plasma in the vacuum chamber 1 can be supplied to the wafer W. A plasma generator capable of supplying the chlorine radicals and hardly supplying the ionized chlorine to the wafer W is used for the plasma generator 90 according to the embodiment. The remote plasma generator is an example of such a plasma generator. However, the plasma generator 90 is not limited to the remote plasma generator, and a variety of plasma generators can be used as long as the plasma generator can mainly generate chlorine radicals while hardly generating chlorine ions.

Figure 10:
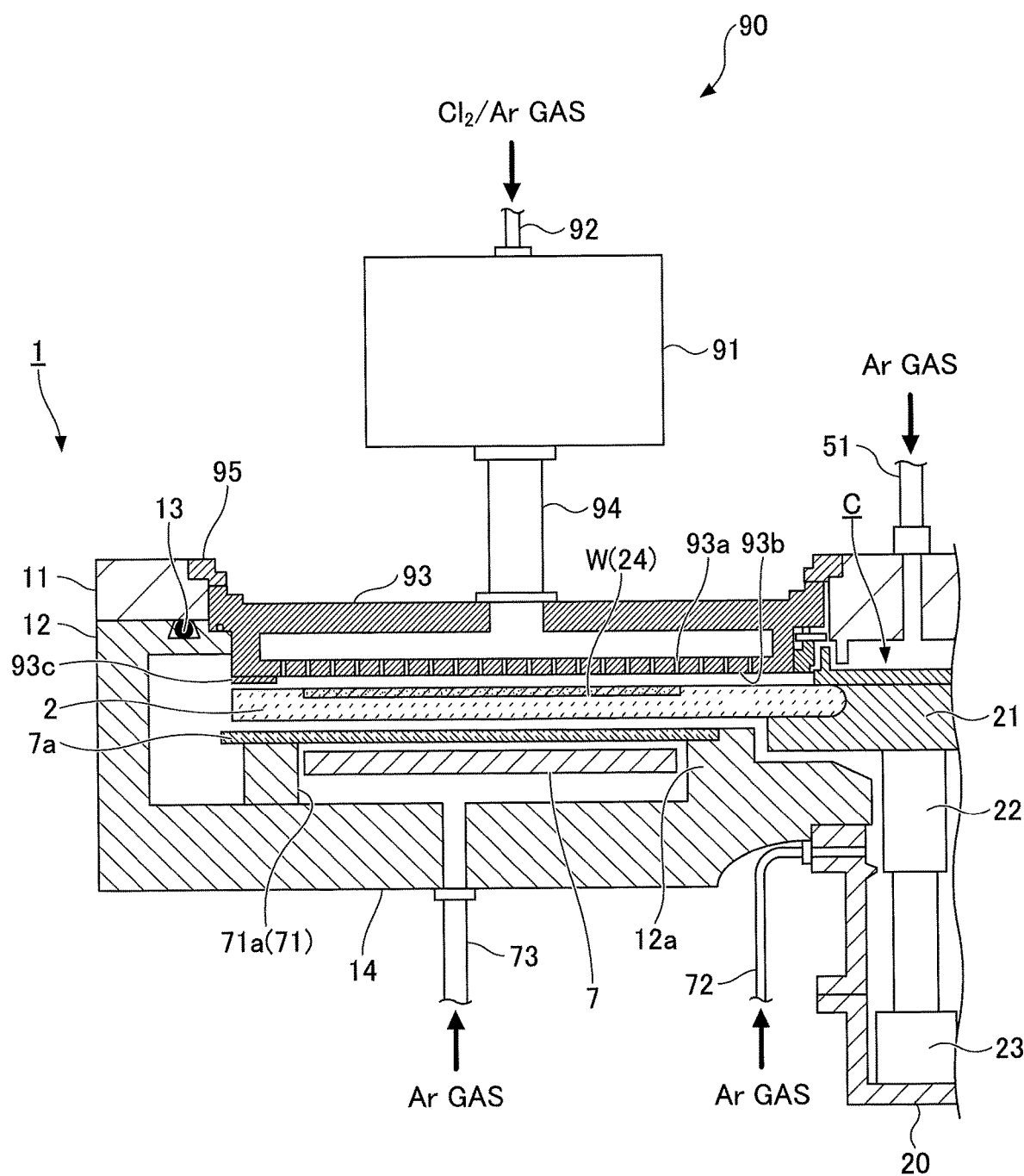
FIG. 10 is a partial cross-sectional view illustrating a third process region in a film deposition apparatus according to an embodiment of the present disclosure.

FIG. 10 is a cross-sectional view of a film deposition apparatus including a plasma generator 90 according to an embodiment.

As illustrated in FIG. 10, the plasma generator 90 is provided opposite to the turntable 2 in the third process region P3. The plasma generator 90 includes a plasma generation part 91, a gas supply pipe 92, a showerhead part 93, and a pipe 94. Here, the showerhead part 93 is an example of a chlorine gas discharge part, and for example, a gas nozzle may be used instead of the showerhead part 93.

The plasma generation part 91 activates chlorine gas supplied from the gas supply pipe 92 using a plasma source. The plasma source is not particularly limited as long as it is capable of activating chlorine gas to generate chlorine radicals. For example, an inductively coupled plasma (ICP), a capacitively coupled plasma (CCP), or a surface wave plasma (SWP) may be used as the plasma source.

The gas supply pipe 92 has one end that is connected to the plasma generation part 91 to supply chlorine gas to the plasma generation part 91. The other end of the gas supply pipe 92 is connected to the chlorine gas supply source 132 that stores chlorine gas via an on-off valve and a flow controller 122, for example.

The showerhead part 93 is connected to the plasma generation part 91 via the pipe 94. The showerhead part 93 supplies chlorine gas that has been activated by the plasma generation part 91 into the vacuum chamber 1. The showerhead part 93 has a fan-like shape in a planar view and is pressed downward along the circumferential direction by a press member 95 that is formed along the outer edge of the fan-like shape. The press member 95 is fixed to the ceiling plate 11 by a bolt or the like (not illustrated), and in this way, the internal atmosphere of the vacuum chamber 1 may be maintained airtight. The distance between a bottom surface of the showerhead part 93 when it is secured to the ceiling plate 11 and a surface of the turntable 2 may be arranged to be about 0.5 mm to about 5 mm, for example.

A plurality of gas discharge holes 93a are arranged at the showerhead part 93. In view of the difference in speed on a rotational center side and an outer peripheral side of the turntable 2, fewer gas discharge holes 93a are arranged on the rotational center side of the showerhead part 93, and more gas discharge holes 93a are arranged on the outer peripheral side of the showerhead part 93. The total number of the gas discharge holes 93a may be several tens to several hundreds, for example. Also, the diameter of the plurality of gas discharge holes 93a may be about 0.5 mm to about 3 mm, for example. Activated chlorine gas supplied to the showerhead part 93 is supplied to the space between the turntable 2 and the showerhead part 93 via the gas discharge holes 93a.

Figure 11:
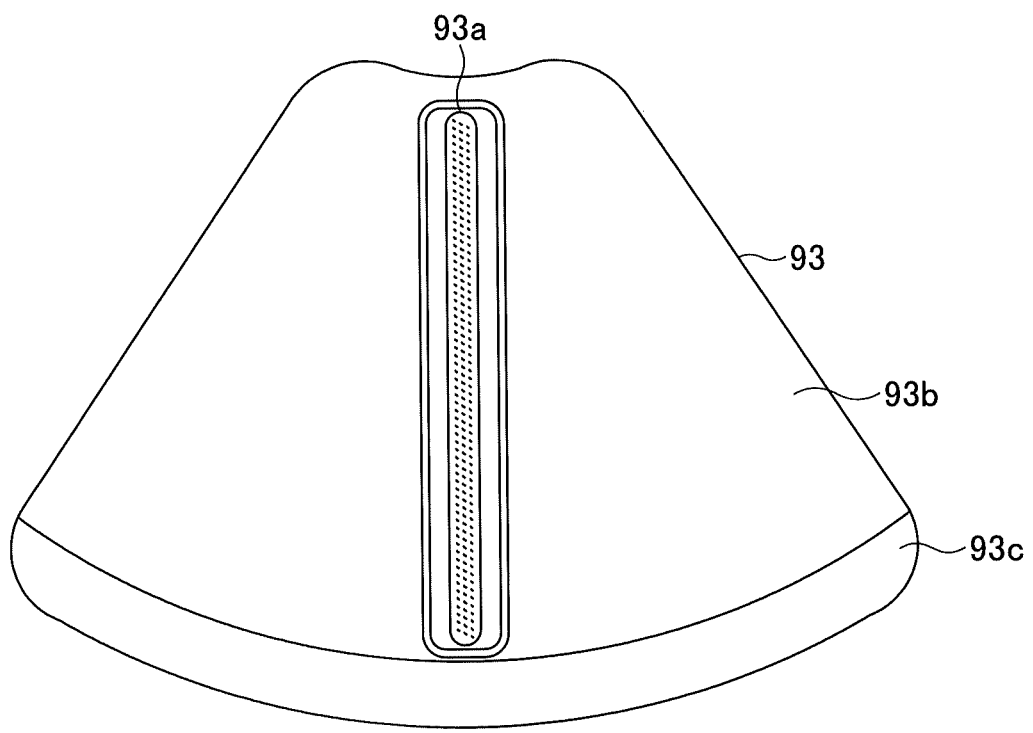
FIG. 11 is a planar view illustrating an example of a lower surface of a showerhead part according to an embodiment of the present disclosure.

FIG. 11 is a planar view illustrating an example of a lower surface of the showerhead part 93. As illustrated in FIG. 11, a downward protruding surface 93c may be provided in a belt-like form along the outer circumference of the lower surface 93b of the fan-shaped showerhead part 93. This can uniformly prevent the pressure on the outer peripheral side of the third process region P3 from decreasing in the circumferential direction. Moreover, the gas discharge holes 93a may be provided at the center of the lower surface 93b of the showerhead part 93 in the circumferential direction so as to extend in the radial direction. Thus, chlorine gas can be supplied in a dispersed manner from the central side throughout the outer peripheral side of the turntable 2.

Thus, activated chlorine gas may be supplied to the wafer W by using the remote plasma generator 90.

Here, the remote plasma generator is not limited to the structure including the showerhead part as illustrated in FIGS. 9 through 11, the remote plasma generator may have the structure using the reaction gas nozzle 33 illustrated in FIGS. 2 and 3. In this case, for example, the plasma generator 91 may be provided on an outer lateral surface of the chamber body 12, and may be configured to supply the chlorine radicals to the reaction nozzle 33 from the outer lateral surface.

As illustrated in FIG. 1, the film deposition apparatus according to the present embodiment further includes a controller 100 that is constituted of a computer and controls the entirety of the film deposition apparatus. A memory in the controller 100 stores a program by which the film deposition apparatus executes the film deposition method (as will be described below) under a control of the control unit 100. The program is formed to include steps capable of executing the film deposition method, and is stored in a medium 102 such as a hard disk, a compact disc, a magneto-optic disk, a memory card, and a flexible disk. A predetermined reading device reads the program into a storage part 101, and the program is installed in the controller 100.

Furthermore, the controller 100 also performs control for performing the method for depositing the silicon nitride film according to the embodiment of the present disclosure, which will be described later.

[Method for Depositing a Silicon Nitride Film]

Next, a method for depositing a silicon nitride film according to an embodiment of the present invention is described below by citing an example of using the above-mentioned film deposition apparatus. The method for depositing the silicon nitride film includes a film deposition process to deposit a silicon nitride film having a V-shaped cross section into a recessed pattern formed in a surface of a substrate by bottom-up growth, and a modification process to modify a deposited silicon nitride film by an activated nitriding gas.

Figure 12:
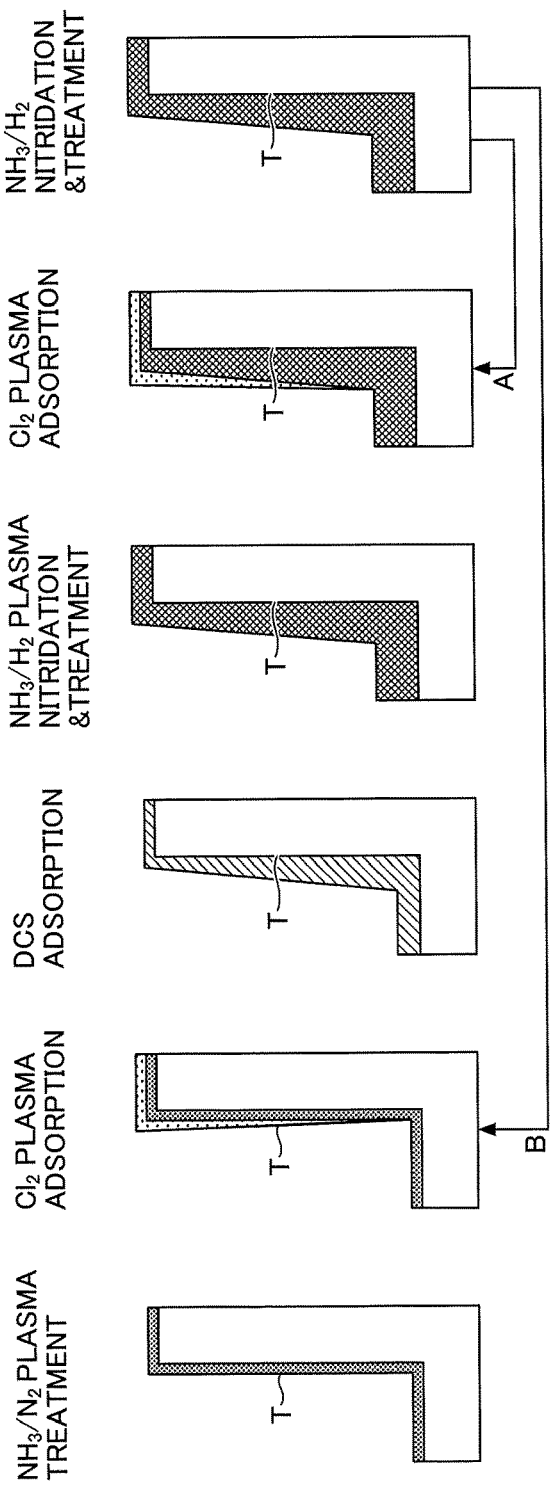
FIGS. 12A through 12G illustrate a series of processes of an example of a method for depositing a silicon nitride film according to an embodiment of the present disclosure.

FIGS. 12A through 12G are diagrams illustrating an example of a series of processes of the bottom-up film deposition process in the film deposition method according to the embodiment of the present disclosure. FIG. 12A is a diagram illustrating an example of a plasma modification process of the method for depositing the silicon nitride film according to the present embodiment.

In this embodiment, a silicon wafer is used as the wafer W, and the silicon wafer has a recessed pattern such as a trench and a via hole. In the following embodiment, as illustrated in FIG. 12A, an example of having a trench T formed in a surface of a wafer W is described. Although the trench T is not required to be formed in a surface of the wafer W as long as a certain trench pattern only has to be formed in the surface of the wafer W to perform filling deposition into the trench and the via hole, an example of forming the trench T in the surface of the wafer W is described for convenience of explanation. However, the method for depositing the silicon nitride film according to the embodiment can be applied to the wafer W in which a variety of patterns is formed including a flat surface.

Moreover, an example of supplying dichlorosilane (DCS, $SiH_2Cl_2$) and nitrogen gas as a carrier gas from the reaction gas nozzle 31, supplying a mixed gas of ammonia ($NH_3$) and argon as a nitriding gas from the reaction gas nozzle 32, and supplying a mixed gas of chlorine and argon as a chlorine-containing gas from the showerhead part 93, is described below. Here, because nitrogen gas that is a carrier gas of dichlorosilane, and argon gas supplied with the nitriding gas and chlorine gas are both inert gases and do not contribute to the reaction, the inert gases will not be particularly referred to hereinafter. Moreover, the nitriding gas is supplied while being activated (converted to plasma) by the ICP plasma generated by the plasma generator 80, and the chlorine-containing gas is supplied while being radicalized by the remote plasma generated by the plasma generator 90. An example of using nitrogen gas as the separation gas (purge gas) is described below.

First, in the film deposition apparatus described with reference to FIGS. 1 through 11, a gate valve (not illustrated in the drawings) is opened, and the transfer arm 10 (FIG. 3) transfers the wafer W from the outside to the concave portion 24 of the turntable 2 via the transfer port 15 (FIG. 2 and FIG. 3). This transfer is performed by raising and lowering the lift pins (not illustrated in the drawings) via through holes provided in the bottom surface of the concave portion 24 from the bottom portion side of the vacuum chamber 1 when the concave portion 24 stops at a position facing the transfer port 15. By repeating such a wafer transfer while intermittently rotating the turntable 2, the wafers W are loaded into the respective concave portions 24.

Next, the gate valve is closed, and the vacuum pump 640 evacuates the vacuum chamber 1 to the attainable degree of vacuum. Then, the separation gas nozzles 41 and 42 discharge Ar gas as a separation gas at a predetermined flow rate. At this time, the separation gas supplying pipe 51 and the purge gas supplying pipes 72 and 73 also discharge Ar gas at a predetermined flow rate, respectively. With this, the pressure regulator 650 (FIG. 1) controls the vacuum chamber 1 to a preset processing pressure. Then, the heater unit 7 heats the wafers W to 400° C., for example, while the turntable 2 is rotated in a clockwise direction at a rotational speed of 10 rpm, for example. The rotational speed of the turntable 2 can be set at a variety of rotational speeds depending on the intended purpose. Also, the plasma generators 80 and 90 are turned on.

Subsequently, the reaction gas nozzle 32 (FIG. 2 and FIG. 3) supplies an activated nitriding gas, and a plasma modification of the surface of the wafer W starts. The surface of the wafer W including the inner surface of the trench T is nitride and modified with plasma. The first plasma modification process performs by rotating the turntable predetermined number of times until sufficiently nitriding the surface of the wafer W, finishes when the surface of the wafer W is modified, and stops the supply of the nitriding gas for a while. The turntable 2 continues to rotate while supporting the wafer W.

Here, the plasma modification process of FIG. 12A is not required, and may be performed as necessary. When the plasma modification process of FIG. 12A is not performed, FIG. 12B only has to be performed without performing the process illustrated in FIG. 12A after supplying the separation gas while rotating the turntable 2. Moreover, after performing the plasma modification process in FIG. 12A for a predetermined period of time, the process in FIG. 12B is subsequently performed. Before entering the process in FIG. 12B, the showerhead part 93 starts supplying chlorine radicals activated by the plasma generator 90, and the reaction gas nozzle 31 starts supplying dichlorosilane in addition to the supply of the nitriding gas from the reaction gas nozzle 32.

FIG. 12B is a diagram illustrating an example of a chlorine radical adsorption process in the film deposition process. When the turntable 2 is rotated while supplying dichlorosilane from the reaction gas nozzle 31, an ammonia-containing gas from the second reaction gas nozzle 32, chlorine radicals from the showerhead part 93, and nitrogen gas from the separation gas nozzles 41 and 42, the wafer W pass a location under the third process region P3, thereby supplying chlorine radicals to the surface of the wafer W from the showerhead part 93. On this occasion, many chlorine radicals readily reach and adsorb on the top surface of the wafer W and an upper portion of the trench T, but because a lower portion of the trench T is deep, chlorine radicals hardly reach a deep portion around the trench T and hardly adsorb on a portion around the bottom surface of the trench T. In other words, an amount of the adsorbed chlorine radicals decreases toward the bottom surface and its neighborhood of the trench T from the upper end of the trench T. FIG. 12B illustrates a state of decrease in chlorine radicals toward the bottom surface of the trench T, to put it the other way around, a state of increase in chlorine radicals toward the top end from the bottom.

Here, chlorine reacts with H groups and generates HCl while forming Cl radical terminals by being replaced with H groups. Such Cl radicals form adsorption blocking groups for a chlorine-containing gas. As discussed above, chlorine radicals readily reach the upper portion of the trench, but scarcely reach the deep portion of the trench T, that is, the lower portion around the bottom portion. Because an aspect ratio of the trench T is high, many chlorine radicals are replaced by H groups before reaching the deep portion of the trench T. Hence, while Cl groups that are adsorption blocking groups densely form on the top surface of the wafer W and the upper portion of the trench T, many H groups of an $NH_2$ structure remain in the lower portion of the trench T and the density of Cl groups decreases.

FIG. 12C is a diagram illustrating an example of a source gas adsorption process in the film deposition process. As illustrated in FIG. 12C, after the wafer W passes the separation region D and is purged by a supplied purge gas, the wafer W passes the first process region P1, where dichlorosilane is supplied to the wafer W. Dichlorosilane hardly adsorbs on the region where Cl groups that is the adsorption blocking groups are present, and adsorbs on a region where the adsorption blocking groups are absent. Hence, many dichlorosilane molecules adsorb on the bottom surface and its neighborhood, and hardly adsorb on the top surface of the wafer W and the upper portion of the trench T. In other words, dichlorosilane that is the source gas densely adsorb on the bottom portion and its vicinity, and less densely adsorb on the upper portion and the top surface of the wafer W.

FIG. 12D is a diagram illustrating an example of a silicon nitride film deposition process in the film deposition process. As illustrated in FIG. 12D, after the wafer W passes the separation region D and is purged by a supplied purge gas, the wafer W passes the second process region P2, where an ammonia-containing gas activated by plasma is supplied to the wafer W. By supplying the ammonia-containing gas to the wafer W, dichlorosilane adsorbed in the trench T and supplied ammonia reacts with each other, thereby forming a molecular layer of a silicon nitride film as a reaction product. Here, because many dichlorosilane molecules adsorb on the bottom portion and its vicinity, a silicon nitride film is deposited much around the bottom surface of the trench T. Hence, the filling deposition with high bottom-up characteristics as illustrated in FIG. 12D can be achieved.

FIGS. 12B through 12D constitute the film deposition process. In the film deposition process, by forming the adsorption blocking region on the upper portion more than the bottom portion of the trench and absorbing the source gas on the bottom portion more than the upper portion of the trench T, bottom-up film deposition can be achieved. Thus, molecular layers of a silicon nitride film having a V-shaped cross section that decreases its film thickness upward from the bottom portion of the trench T can be deposited.

FIG. 12E is a diagram illustrating an example of a chlorine radical adsorption process in a modification process. In performing the modification process, the supply of the source gas from the reaction gas nozzle 31 is stopped, and the supply of the nitriding gas from the reaction gas nozzle 32, the chlorine radicals from the showerhead part 93, and the supply of nitrogen gas from the separation gas nozzles 41 and 42 are continuously performed. In other words, only the supply of dichlorosilane that is the source gas is stopped, and the supply of the other gas is continuously performed.

On this occasion, when the wafer W passes the third process region P3, the showerhead part 93 supplies chlorine radicals to the wafer W. The supply of chlorine radicals at this time is the same as the chlorine radical adsorption process described with reference to FIG. 12B except that the molecular layers of the silicon nitride film having the V-shaped cross section are deposited in the trench T of the wafer W and that the molecular layers of the silicon nitride film are also deposited on the top surface of the wafer W outside the trench T. In other words, chlorine radicals adsorb on the surface of the silicon nitride film so that an amount of adsorption (or adsorption density) increases upward from the bottom surface of the trench T. Hence, in the trench T, chlorine radicals adsorb on the surface of the silicon nitride film having the V-shaped cross section so that the adsorption density is higher at the upper portion than at the bottom portion.

FIG. 12F is a diagram illustrating an example of a plasma nitriding process in the modification process. By the rotation of the turntable 2, when the wafer W passes the second process region P2 via the supply of the purge gas in the separation regions D on both sides of the first process region P1, the nitriding activated by the plasma generator 80 is supplied to the wafer W. Thus, the silicon nitride film having the V-shaped cross section is nitrided and modified by the plasma. Here, because the supply of the source gas is stopped in the first process region P1, the wafer W reaches the second process region P2 in a state in which only the surface of the wafer W is purged. Then, the nitriding gas activated by the plasma contributes only to the modification of the deposited silicon nitride film. At this time, chlorine radicals adsorbed on the surface of the silicon nitride film disappears. Because the adsorption of chlorine radicals does not depend on adsorption by chemical reaction but depends on physical adsorption based on the difference in electronegativity between hydrogen and chlorine of an $NH_2$ group, the adsorption has only an adsorption force that continues to adsorb on the surface of the silicon nitride film or the wafer W during one revolution of the turntable 2 at most. In contrast, ammonia plasma causes a chemical reaction that reacts with unreacted silicon atoms inside the deposited silicon nitride film, and has high energy because the ammonia plasma is activated by the plasma generator 80. Hence, chlorine radicals physically adsorbed on the surface of the silicon nitride film are expelled from the surface of the silicon nitride film by the supply of nitriding gas activated by plasma, and disappear. Thus, chlorine radicals adsorbed on the surface of the silicon nitride film in the chlorine radical adsorption process does not affect the plasma modification, and the modification of the silicon nitride film is performed without any problem.

Here, considering such a way, the chlorine radical adsorption process in the modification process is considered unnecessary. However, when a turntable type film deposition apparatus is used, continuously supplying a gas is easier to design a sequence if there is no need to stop the gas when the supply of the gas is started once. In the method for depositing the silicon nitride film according to the embodiment, the supply of the source gas is stopped because the modification process cannot be performed if the supply of the source gas is not stopped, and because the source gas is expensive. However, because chlorine radicals do not affect the plasma modification even if supplied, because the supply of chlorine radicals is needed in the subsequent film deposition process, and because chlorine gas is not expensive, such a sequence is adopted.

The modification process illustrated in FIGS. 12E and 12F are repeated a predetermined number of times of one or more as illustrated by a loop A. The minimum number is one time, but the modification process is preferably repeated two or more times. By performing the modification process, the silicon nitride film having grown from the bottom and having the V-shaped cross section can be modified while maintaining the V-shaped cross section. In particular, the thick silicon nitride film of the bottom portion likely to be insufficiently modified can be sufficiently modified, and the difference in the film quality between at the upper portion and the bottom portion can be reduced. For example, the modification process may be repeated 2 to 7 times, preferably 2 to 5 times, and further preferably about 3 times.

After the modification process is repeated the predetermined number of times, as illustrated by a loop B, the process returns to FIG. 12B, where the film deposition process is performed again. In this case, similarly, after the chlorine radical adsorption process of FIG. 12B, the source gas adsorption process of FIG. 12C, and the silicon nitride film deposition process of FIG. 12D are each performed one time, the chlorine radical adsorption process of FIG. 12E and the plasma nitriding process of FIG. 12F are repeated a predetermined number of times. In other words, the modification process is performed the predetermined number of times relative to one time of the film deposition process. By doing this, the trench T is filled with the silicon nitride film having the V-shaped cross section, and the silicon nitride film can be modified while keeping the V-shaped cross section. Thus, the bottom-up film deposition serves to perform the filling deposition without generating a void or a seam while achieving the dense and high-quality film even at the bottom portion.

FIG. 12G is a diagram illustrating a state in which the trench T is filled with a silicon nitride film 110 part of the way. As illustrated in FIG. 12G, because the trench T is filled with the silicon nitride film 110 having grown form the bottom and having the v-shaped cross section, the trench T can be filled with the silicon nitride film 110 while keeping a state unlikely to generate a void or a seam without closing an opening of the upper portion of the trench T. Moreover, the silicon nitride film 110 is sufficiently modified, and the fine and dense silicon nitride film can be formed even at the bottom portion having the thick film.

Figure 13:
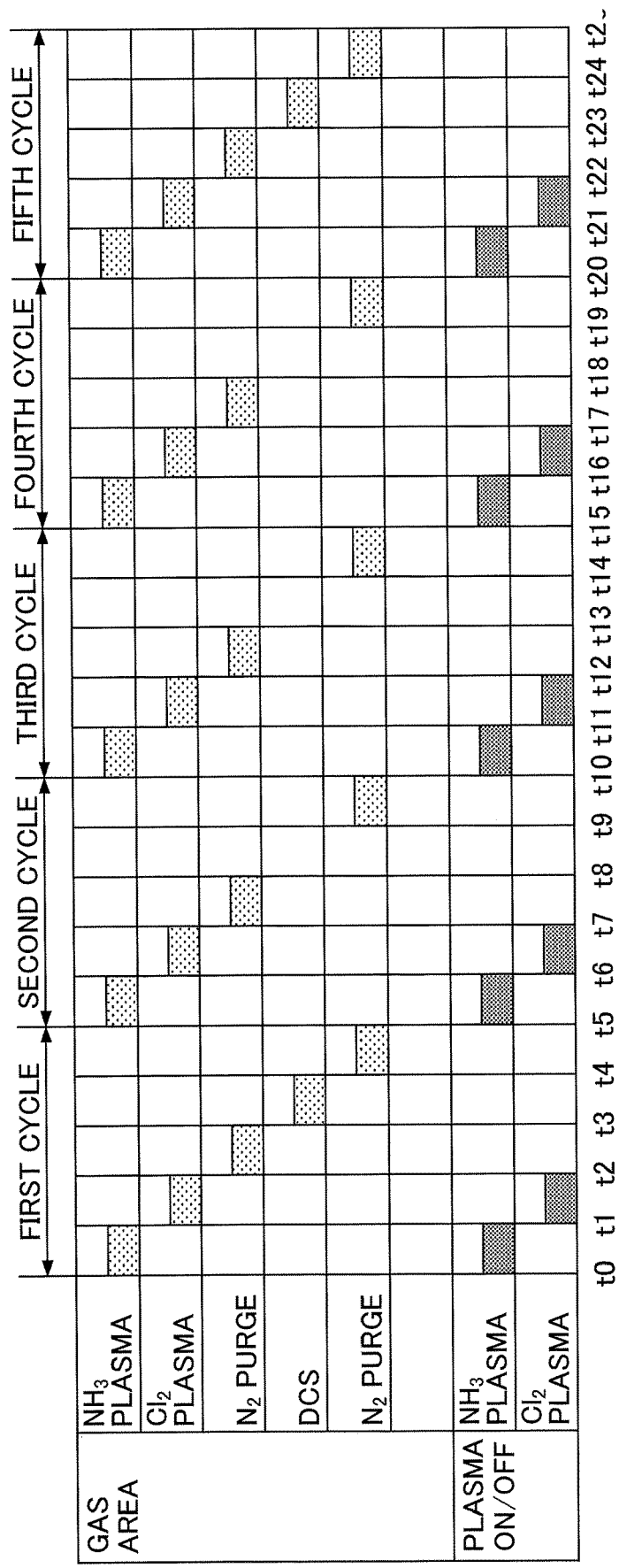
FIG. 13 is a diagram illustrating an example of a sequence of a method for depositing a silicon nitride film according to an embodiment of the present disclosure.

FIG. 13 is a diagram illustrating an example of a sequence of the method for depositing the silicon nitride film according to an embodiment of the present disclosure. In FIG. 13, a horizontal axis shows a time axis, and a vertical axis shows types of supplying gases and an on-off of plasma. FIG. 13 illustrates a sequence of 1 to 5 cycles. The first cycle and the fifth cycle correspond to the film deposition process described with reference to FIGS. 12A through 12D, and the second to fourth cycles correspond to the modification process described with reference to FIGS. 12E and 12F.

A period of time t1 to t5 illustrates a sequence of a first revolution of the turntable 2. As described above, by the rotation of the turntable 2, the wafer W placed on the concave portion 23 of the turntable 2 sequentially passes the second process region P2, the third process region P3, the separation region D, the first process region P1, and the separation region D.

FIG. 13 illustrates a sequence of timing when each gas is actually supplied to a surface of a wafer W. More specifically, in the above-mentioned film deposition apparatus, the reaction gas nozzles 31 and 32, the showerhead part 93, and the separation gas nozzle 41 and 42 continuously supply the gases; the wafer W moves by the rotation of the turntable 2; and the gases are supplied to the wafer W at timing when the wafer W passes the first to third process regions P1 through P3 and the separation regions D, respectively, but the sequence in FIG. 13 does not illustrate timing when the film deposition apparatus supplies gas, but illustrates timing when the gases are supplied to the surface of the wafer W. Thus, the sequence in FIG. 13 can be applied to not only the turntable type film deposition apparatus but also a film deposition apparatus in which gases are supplied into a process chamber containing a wafer W therein while changing types of the gases sequentially.

During a period from time t0 to t1, a nitriding process is performed. When the wafer W passes the second process region P2, ammonia gas supplied from the second reaction gas nozzle 32 is activated by the plasma generator 80 and is supplied to the surface of the wafer W. This is substantially the same as the plasma modification process described with reference to FIG. 12A. By such a nitriding process, $NH_2$ groups adsorb on the entire surface of the wafer W including the inner surface of the trench T, and an adsorption site is formed on the entire surface of the wafer W.

Here, as necessary, the plasma modification process may be performed for a longer period of time before time t0, and the surface of the wafer W may be sufficiently nitrided.

During a period from time t1 to t2, a chlorine radical adsorption process is performed. When the wafer W passes the third process region P3 by the rotation of the turntable 2, the showerhead part 93 of the plasma generator 90 supplies chlorine radicals to the surface of the wafer W. As described with reference to FIG. 12B, many chlorine radicals adsorb on the top surface of the wafer W and the upper portion of the trench T, but hardly adsorb on the lower portion including the bottom surface of the trench T. Hence, different amounts of chlorine radicals adsorb on the inner surface of the trench T depending on the depth in the trench T. The region where chlorine radicals have adsorbed becomes an adsorption blocking region against dichlorosilane containing chlorine, and the region where chlorine radicals do not adsorb remains as the adsorption site formed in the nitriding process. Here, the adsorption blocking region may be referred to as a non-adsorption site.

During a period from time t2 to t3, a purge process is performed. When the wafer W passes the separation region D by the rotation of the turntable 2, nitrogen gas is supplied to the surface of the wafer W, and the surface of the wafer W is purged and cleaned.

During a period from time t3 to t4, a source gas adsorption process is performed. When the wafer W passes the first process region P1 by the rotation of the turntable 2, the reaction gas nozzle 31 supplies dichlorosilane to the surface of the wafer W, and dichlorosilane adsorbs on the surface of the wafer W. On this occasion, as described with reference to FIG. 12C, dichlorosilane adsorb on the adsorption site having $NH_2$ groups much, but do not adsorb on the adsorption blocking region having adsorbed chlorine very much. Hence, dichlorosilane adsorbs on the lower portion of the trench T where the adsorption site is exposed much, but do not adsorb on the upper portion of the trench T and the top surface of the wafer W very much.

During a period from time t4 to t5, a purge process is performed. As described in the period from time t2 to t3, when the wafer W passes the separation region D by the rotation of the turntable 2, nitrogen gas is supplied to the surface of the wafer W, and the surface of the wafer W is purged and cleaned.

During a period from time t5 to t6, a nitriding process (or silicon nitride film deposition process) is performed. When the wafer passes the second process region P2 by the rotation of the turntable 2, ammonia gas supplied from the reaction gas nozzle 32 is activated by the plasma generator 80, then supplied to the surface of the wafer W, and reacts with dichlorosilane adsorbed on the surface of the wafer W, thereby depositing a molecular layer of a silicon nitride film that is a reaction product on the surface of the wafer W. As described above, because dichlorosilane adsorbs on the lower portion including the bottom surface of the trench T, the silicon nitride film is thickly deposited on the lower portion of the trench T. In contrast, the silicon nitride film is thinly deposited on the upper portion of the trench T and the top surface of the wafer W where dichlorosilane has hardly adsorbed. Thus, the silicon nitride film 110 having the V-shaped cross section described with reference to FIGS. 12D and 12E is deposited in the trench T.

During a period from time t6 to t7, a chlorine radical adsorption process in the modification process is performed. When the wafer W passes the third process region P3 again by the rotation of the turntable 2, the showerhead part 93 of the plasma generator 90 supplies chlorine radicals to the wafer W. As described with reference to FIG. 12E, many chlorine radicals adsorb on the upper portion of the silicon nitride film having the V-shaped cross section, but hardly adsorb on the lower portion of the silicon nitride film including the bottom surface of the trench T. Hence, different amounts of chlorine radicals adsorb on the deposited V-shaped silicon nitride film depending on a location in the depth direction of the trench T. The silicon nitride film has $NH_2$ groups on its surface, which forms an adsorption site for the source gas. Hence, the region where chlorine radicals have adsorbed becomes an adsorption blocking region (non-adsorption site) against dichlorosilane that contains chlorine, and the region where chlorine radicals do not adsorb remains as the adsorption site formed in the nitriding process.

During a period from time t7 to t8, a purge process is performed again. When the wafer W passes the separation region D by the rotation of the turntable 2, nitrogen gas is supplied to the surface of the wafer W as a purge gas, and the surface of the wafer W is purged and cleaned.

During a period from time t8 to t9, the wafer W passes the first process region P1. In the modification process, because the reaction gas nozzle 31 stops supplying dichlorosilane that is the source gas, the wafer W passes the first process region P1 without receiving the supply of the source gas.

Here, the supply of source gas just has to be stopped before the wafer W passes the first process region P1, but the supply of the source gas is preferably stopped promptly when entering the second cycle.

During a period from time t9 to t10, a purge process is performed. As described in the period from time t7 to t8, when the wafer W passes the separation region D by the rotation of the turntable 2, nitrogen gas is supplied to the wafer W as the purge gas, and the surface of the wafer W is purged and cleaned.

During a period from time t10 to t11 in the third cycle, a plasma nitriding process is performed. As described with reference to FIG. 12F, a nitriding gas activated by plasma is supplied to the surface of the wafer W, the silicon nitride film having the V-shaped cross section in the trench T is nitrided by plasma, and is modified. Thus, the plasma modification is performed even for the silicon nitride film at the bottom portion whose film thickness is thick. Moreover, chlorine radicals physically adsorbed on the silicon nitride film at the period from time t6 to t7 disappears by the supply of the nitriding plasma.

From time t11 to t21, the modification process described at the period from time t6 to t11 is repeated twice. By repeating such a modification process, even the bottom portion of the silicon nitride film having the V-shaped cross section deposited in the trench T is sufficiently nitrided, a fine and high-density silicon nitride film is deposited.

During a period from time t21 to t25, the film deposition process described at the period from time t1 to t5 is repeated again. The sequence in FIG. 13 illustrates a sequence of performing the modification process three times relative to one time film deposition process as an example. Although a number of repetitions of the modification process can be set variously as long as the number of repetitions is at least one, the number of repetitions is preferably set at two or more in terms of sufficiently modifying the silicon nitride film filled in the trench T. However, when the modification processes are performed too many times, because the productivity decreases, an appropriate number of repetitions can be determined in terms of the film quality and the productivity.

Figure 14:
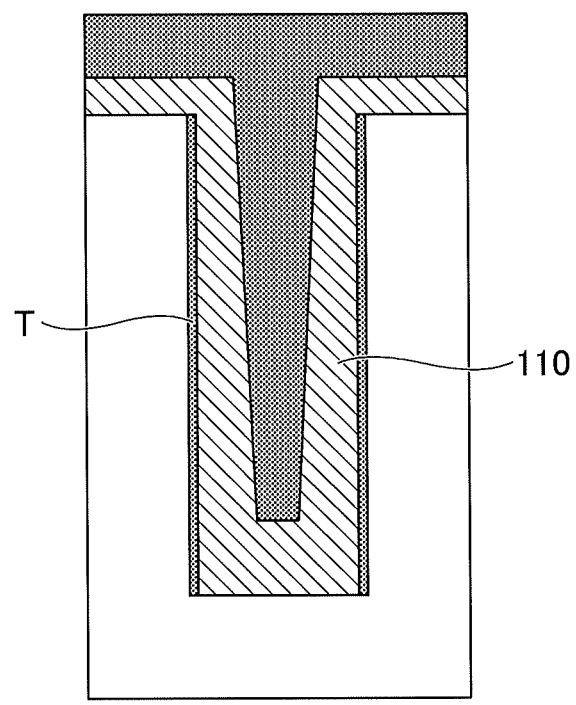
FIG. 14 is a diagram illustrating an example of filling film a trench by a method for depositing a silicon nitride film according to an embodiment of the present disclosure.

FIG. 14 is a diagram illustrating an example of filling a trench T by the method for depositing the silicon nitride film according to the embodiment of the present disclosure. A silicon nitride film 110 having the V-shaped cross section is grown up from the bottom of the trench T and is modified, thereby finally filling up the entire trench T with a high-quality silicon nitride film.

Here, an example of using dichlorosilane as the source gas is described in the embodiment, but a variety of gases can be used as the source gas as long as the gas contains silicon and chlorine. For example, as described above, in addition to dichlorosilane, a variety of chlorosilane-based gases such as monochlorosilane ($SiH_3Cl$), trichlorosilane ($SiHCl_3$) and hexachlorosilane ($Si_2Cl_6$) may be used as the source gas. Also, a variety of nitriding gases can be used as the nitriding gas as long as the nitriding gas contain ammonia and nitrogen and can deposit a silicon nitride film as a reaction product by nitriding the source gas due to the activation of plasma. Similarly, a variety of chlorine-containing gases can be used as long as the chlorine-containing gas can form an adsorption blocking region on a surface of a wafer W by chlorine radicals.

The sequence described in FIGS. 12A through 12G and 13 can be executed by the controller 100 of the above-mentioned film deposition apparatus. The controller 100 controls periods of gas supply, timings, operation of the plasma generators 80 and 90, thereby performing the sequence. Because the film deposition apparatus according to the embodiment can rotate the turntable 2 and can change a gas supply pattern, the film deposition apparatus can control a gas supply period by controlling a number of revolutions while keeping the same gas supply conditions. Thus, because the film deposition apparatus according to the embodiment can readily implement the sequence in FIGS. 12 and 13 while readily controlling an adsorption amount of each gas, the method for depositing the silicon nitride film can be preferably performed.

As discussed above, according to the embodiments of the present disclosure, a recessed pattern can be filled with a high-quality silicon nitride film by bottom-up growth while preventing generation of a void.

All examples recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A method for depositing a silicon nitride film to fill a recessed pattern formed in a surface of a substrate with a silicon nitride film, comprising steps of:
    forming a first adsorption blocking region by adsorbing first chlorine radicals such that an amount of adsorption increases upward from a bottom portion of the recessed pattern;
    adsorbing a source gas that contains silicon and chlorine on an adsorption site where the first adsorption blocking region is not formed of the surface of the substrate including an inner surface of the recessed pattern by supplying the source gas to the surface of the substrate;

depositing a molecular layer of a silicon nitride film having a V-shaped cross section that decreases its film thickness upward from the bottom portion of the recessed pattern by nitriding the source gas adsorbed on the adsorption site with a first nitriding gas activated by a first plasma;

forming a second adsorption blocking region by adsorbing second chlorine radicals on the molecular layer of the silicon nitride film such that an amount of adsorption increases upward from the bottom portion; and modifying the molecular layer of the silicon nitride film by nitriding the molecular layer while removing the second adsorption blocking region by supplying a second nitriding gas activated by a second plasma to the surface of the substrate.

2. The method according to claim 1, wherein the steps of forming the first adsorption blocking region, adsorbing the source gas and depositing the molecular layer is made a film deposition process, and the steps of forming the second adsorption blocking region and modifying the molecular layer are made a modification process, and wherein a cycle of performing the film deposition process one time and the modification process a predetermined number of times of one or more consecutively is made one cycle, and wherein the one cycle is repeated a plurality of cycles.

3. The method according to claim 2, wherein the predetermined number of times is two or more.

4. The method according to claim 2, further comprising:

supplying a first purge gas to the surface of the substrate between the steps of forming the first adsorption blocking region and adsorbing the source gas; and supplying a second purge gas to the surface of the substrate between the steps of adsorbing the source gas and depositing the silicon nitride film.

5. The method according to claim 4, further comprising:

supplying a third purge gas to the surface of the substrate between the steps of forming the second adsorption blocking region and modifying the molecular layer of the silicon nitride film.

6. The method according to claim 4, wherein the substrate is placed on a surface of a turntable along a circumferential direction thereof, the turntable being provided in a chamber, wherein a chlorine radical adsorption region capable of supplying the first chlorine radicals and the second chlorine radicals to the substrate, a first purge region capable of supplying a third purge gas to the substrate, a source gas adsorption region capable of supplying the source gas to the substrate, a second purge region capable of supplying a fourth purge gas to the substrate, and a nitriding region capable of supplying the activated first nitriding gas and the activated second nitriding gas to the substrate are provided above the turntable and along the circumferential direction of the turntable, wherein the film deposition step is performed by rotating the turntable while supplying the first chlorine radicals in the chlorine radical adsorption region, the source gas in the source gas adsorption region, the activated first nitriding gas in the nitriding region, and the first purge gas in the first purge region, and the second purge gas in the second purge region to the substrate, and wherein the modification step is performed by rotating the turntable while supplying the second chlorine radicals in the chlorine radical adsorption region, the activated second nitriding gas in the nitriding region, the first purge gas in the first purge region and the second purge gas in the second purge region, without supplying the source gas in the source gas adsorption region.

7. The method according to claim 1, further comprising:

modifying the surface of the substrate including the inner surface of the recessed pattern by nitriding the surface with a nitriding gas activated by second plasma before the step of forming the first adsorption blocking region in a first cycle of the film deposition process.

8. The method according to claim 1, wherein the steps of forming the first adsorption blocking region and forming the second adsorption blocking region comprises supplying the first chlorine radicals from a showerhead and supplying the second chlorine radicals from the showerhead, respectively.

9. The method according to claim 1, wherein the steps of forming the first adsorption blocking region and forming the second adsorption blocking region comprises supplying the first chlorine radicals generated by a remote plasma generator and supplying the second chlorine radicals generated by the remote plasma generator, respectively.

10. The method according to claim 1, wherein the steps of depositing the molecular layer of the silicon nitride film and modifying the molecular layer of the silicon nitride film comprises supplying the first nitriding gas activated by a first inductively coupled plasma and supplying the second nitriding gas activated by a second inductively coupled plasma.

11. The method according to claim 1, wherein the first nitriding gas and the second nitriding gas are an ammonia-containing gas.

12. The method according to claim 1, wherein the source gas is dichlorosilane.

* * * * *